United States Patent
Katti

(10) Patent No.: US 11,054,438 B2
(45) Date of Patent: Jul. 6, 2021

(54) MAGNETIC SPIN HALL EFFECT SPINTRONIC ACCELEROMETER

(71) Applicant: Honeywell International Inc., Morris Plains, NJ (US)

(72) Inventor: Romney R. Katti, Shorewood, MN (US)

(73) Assignee: Honeywell International Inc., Charlotte, NC (US)

( * ) Notice: Subject to any disclaimer, the term of this patent is extended or adjusted under 35 U.S.C. 154(b) by 231 days.

(21) Appl. No.: 16/420,087

(22) Filed: May 22, 2019

(65) Prior Publication Data

US 2020/0309813 A1 Oct. 1, 2020

Related U.S. Application Data

(60) Provisional application No. 62/826,460, filed on Mar. 29, 2019.

(51) Int. Cl.
*G01P 15/105* (2006.01)
*G01R 15/20* (2006.01)
(Continued)

(52) U.S. Cl.
CPC .......... *G01P 15/105* (2013.01); *G01R 15/202* (2013.01); *G01P 15/0802* (2013.01); *G01P 15/12* (2013.01)

(58) Field of Classification Search
CPC ...... G01P 15/02; G01P 15/08; G01P 15/0802; G01P 15/105; G01P 15/12; G01R 15/202; G01R 33/07; G01R 33/072
See application file for complete search history.

(56) References Cited

U.S. PATENT DOCUMENTS

| 8,228,715 B2 | 7/2012 | Andre et al. |
| 8,687,412 B2 | 4/2014 | Chih et al. |
| (Continued) | | |

FOREIGN PATENT DOCUMENTS

| CN | 106940386 A | 7/2017 |
| JP | H10115505 A | 5/1998 |

OTHER PUBLICATIONS

Cai et al., "High Performance MRAM with Spin-Transfer-Torque and Voltage-Controlled Magnetic Anisotropy Effects," Applied Sciences, Sep. 11, 2017, 13 pp.
(Continued)

*Primary Examiner* — Benjamin R Schmitt
(74) *Attorney, Agent, or Firm* — Shumaker & Sieffert, P.A.

(57) ABSTRACT

An example device for detecting acceleration using a spintronic Hall effect includes a spin Hall effect structure, a Magnetic Tunnel Junction (MTJ) element, a magnetic structure, and processing circuitry. The MTJ element includes a free structure, a pinned structure, and a tunnel barrier arranged between the free structure and the pinned structure. The magnetic structure is spaced apart from the spin Hall effect structure such that a magnetic field generated by the magnetic structure is moved relative to the spin Hall effect structure during acceleration. The processing circuitry is configured to generate electrical current through the spin Hall effect structure, measure a resistance at the MTJ element, and determine acceleration based on the resistance at the MTJ element.

20 Claims, 27 Drawing Sheets

(51) Int. Cl.
  *G01P 15/08*     (2006.01)
  *G01P 15/12*     (2006.01)

(56) References Cited

U.S. PATENT DOCUMENTS

| | | |
|---|---|---|
| 9,069,033 B2 | 6/2015 | Chen et al. |
| 9,383,208 B2 | 7/2016 | Mohanty |
| 9,391,262 B1 | 7/2016 | Nikonov et al. |
| 9,461,243 B2 | 10/2016 | Guo |
| 9,620,188 B2 | 4/2017 | Manipatruni et al. |
| 9,691,458 B2 | 6/2017 | Ralph et al. |
| 9,947,382 B2 | 4/2018 | Buhmian et al. |
| 10,008,248 B2 | 6/2018 | Buhmian et al. |
| 10,135,392 B2 | 11/2018 | Wei et al. |
| 2007/0209437 A1 | 9/2007 | Xue et al. |
| 2016/0153780 A1 | 6/2016 | Zhang et al. |
| 2018/0033954 A1 | 2/2018 | Aradhya et al. |
| 2020/0080844 A1* | 3/2020 | Katti ........................ H01L 27/22 |
| 2020/0081078 A1* | 3/2020 | Katti ........................ G11C 11/16 |

OTHER PUBLICATIONS

Lenz et al., "Magnetic Sensors and Their Applications," IEEE Sensors Journal, vol. 6, No. 3, Jun. 2006, 19 pp.
Locatelli et al., "Spin torque building blocks," Nature Materials, Dec. 17, 2013, 15 pp.
Vignale, "Ten Years of Spin Hall Effect," Springer Science+ Business, published online Oct. 1, 2009, 8 pp.
Dyakonov, "Spin Hall Effect," published in Nature Materials, Apr. 23, 2012, 12 pp.

* cited by examiner

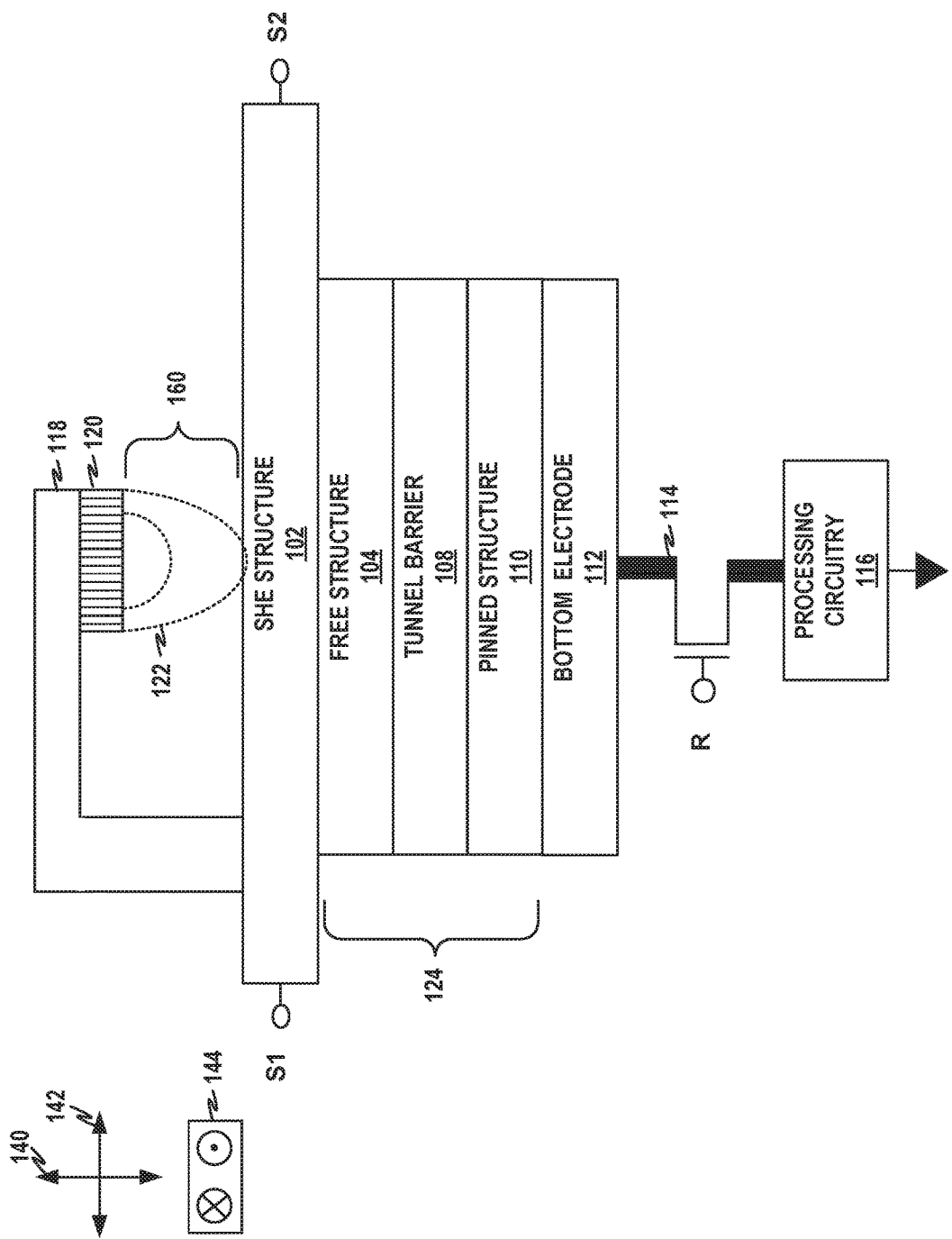

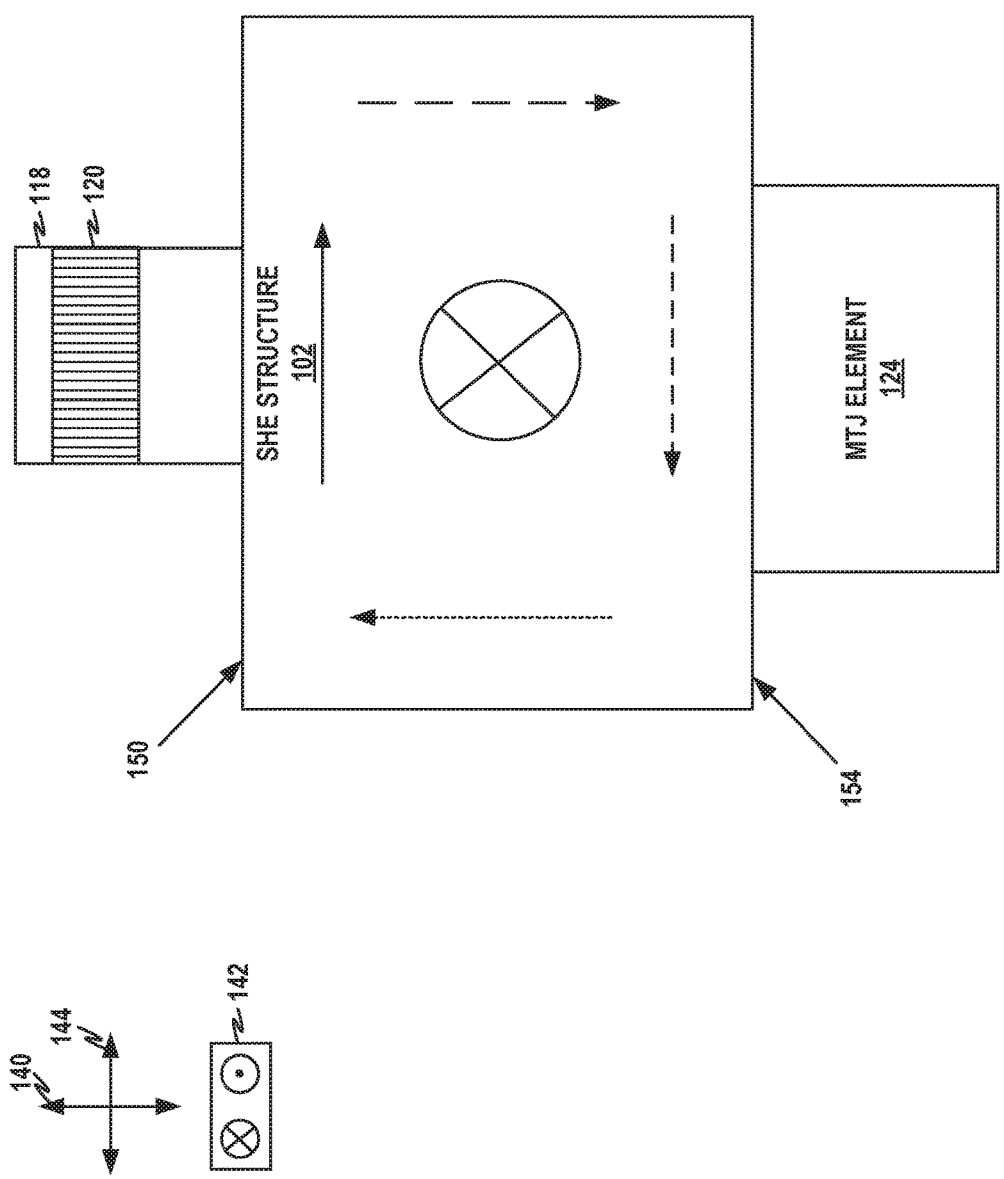

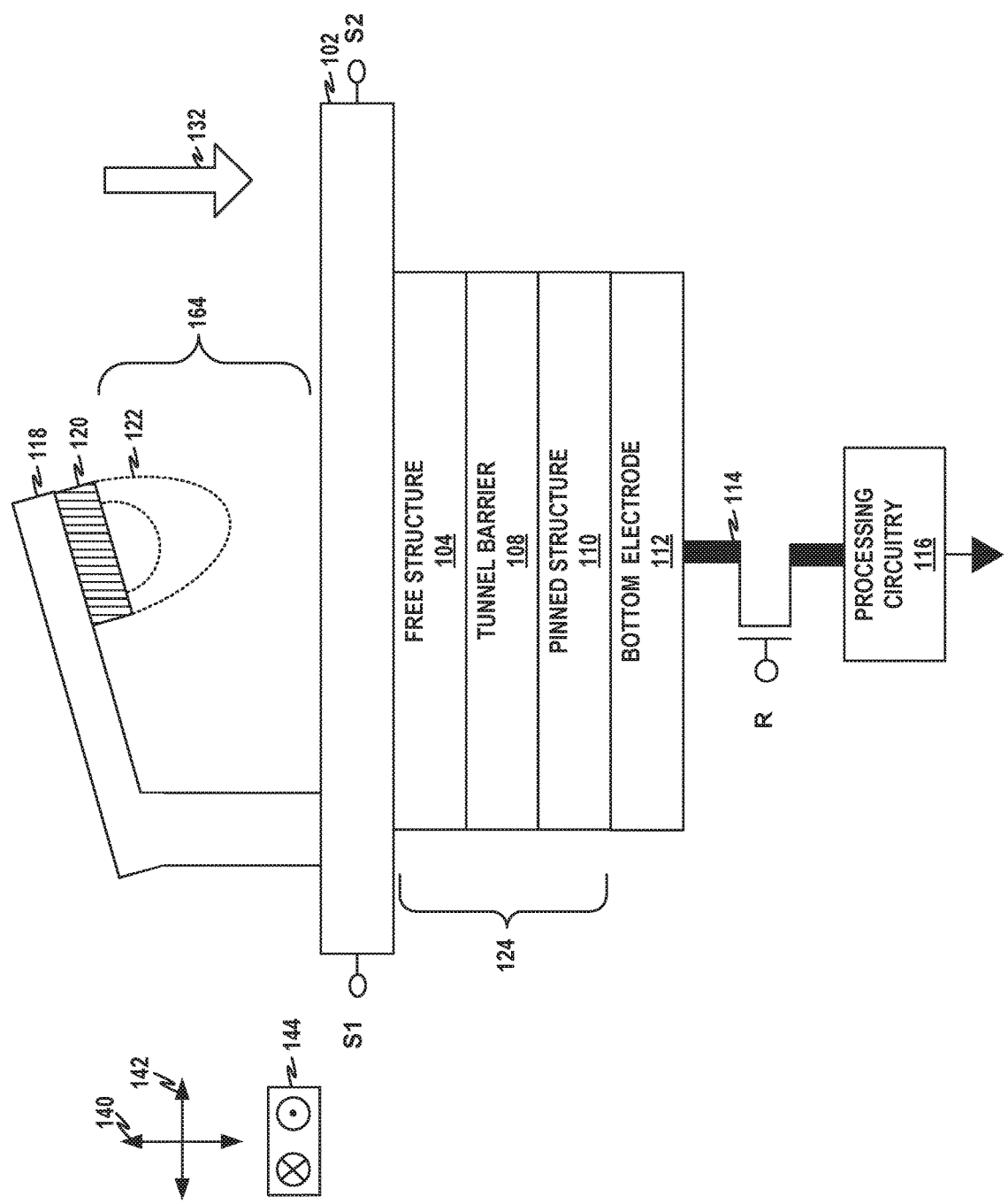

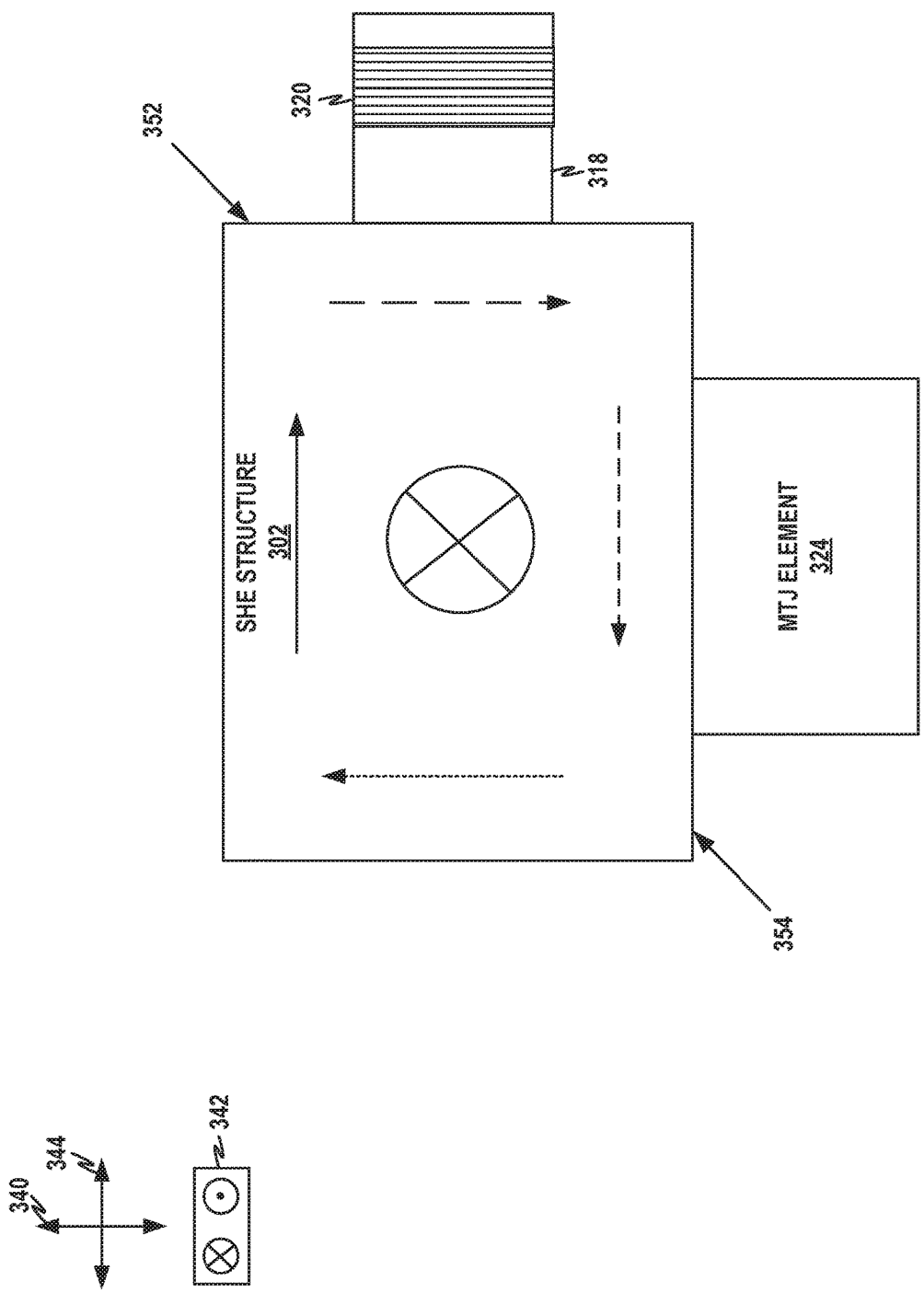

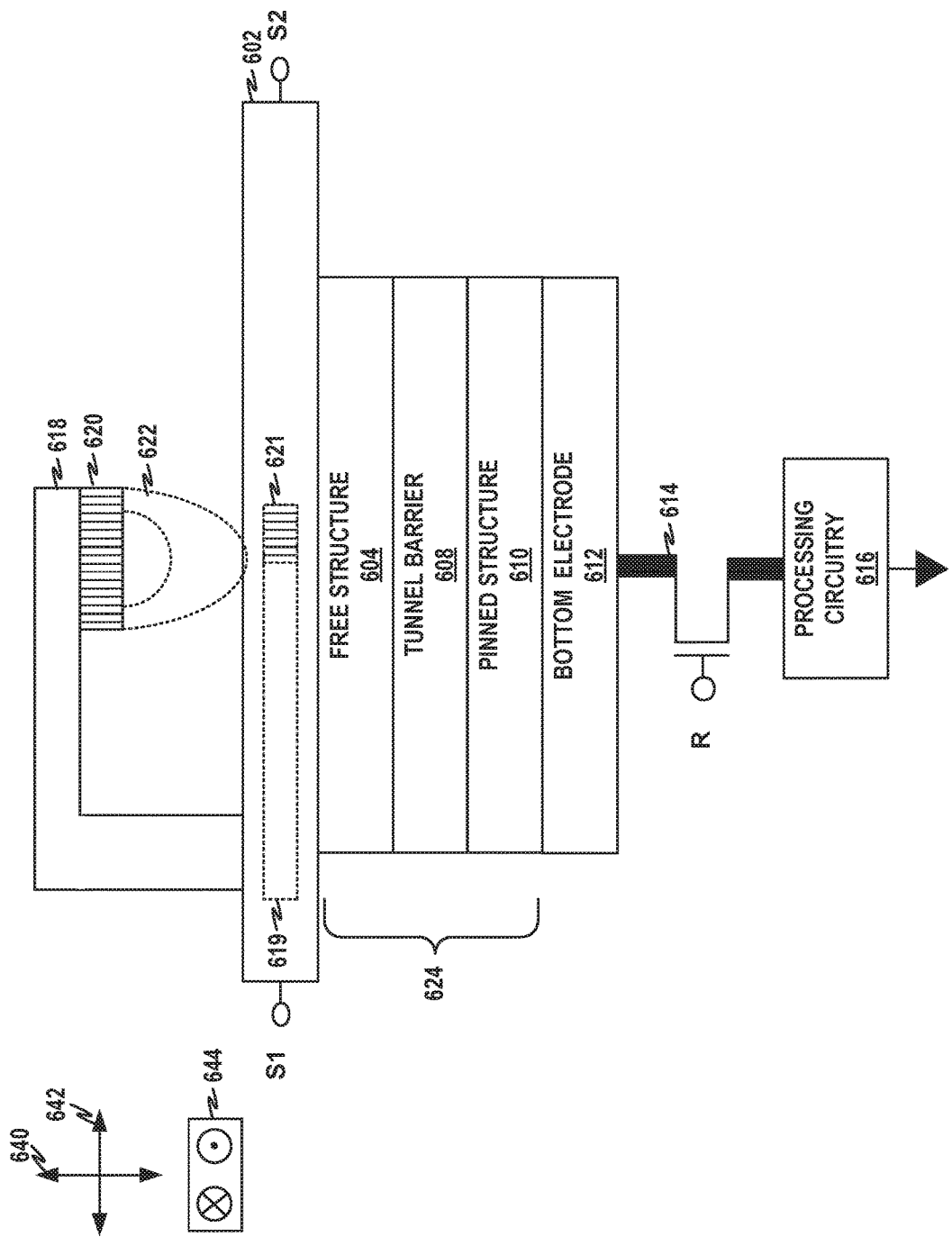

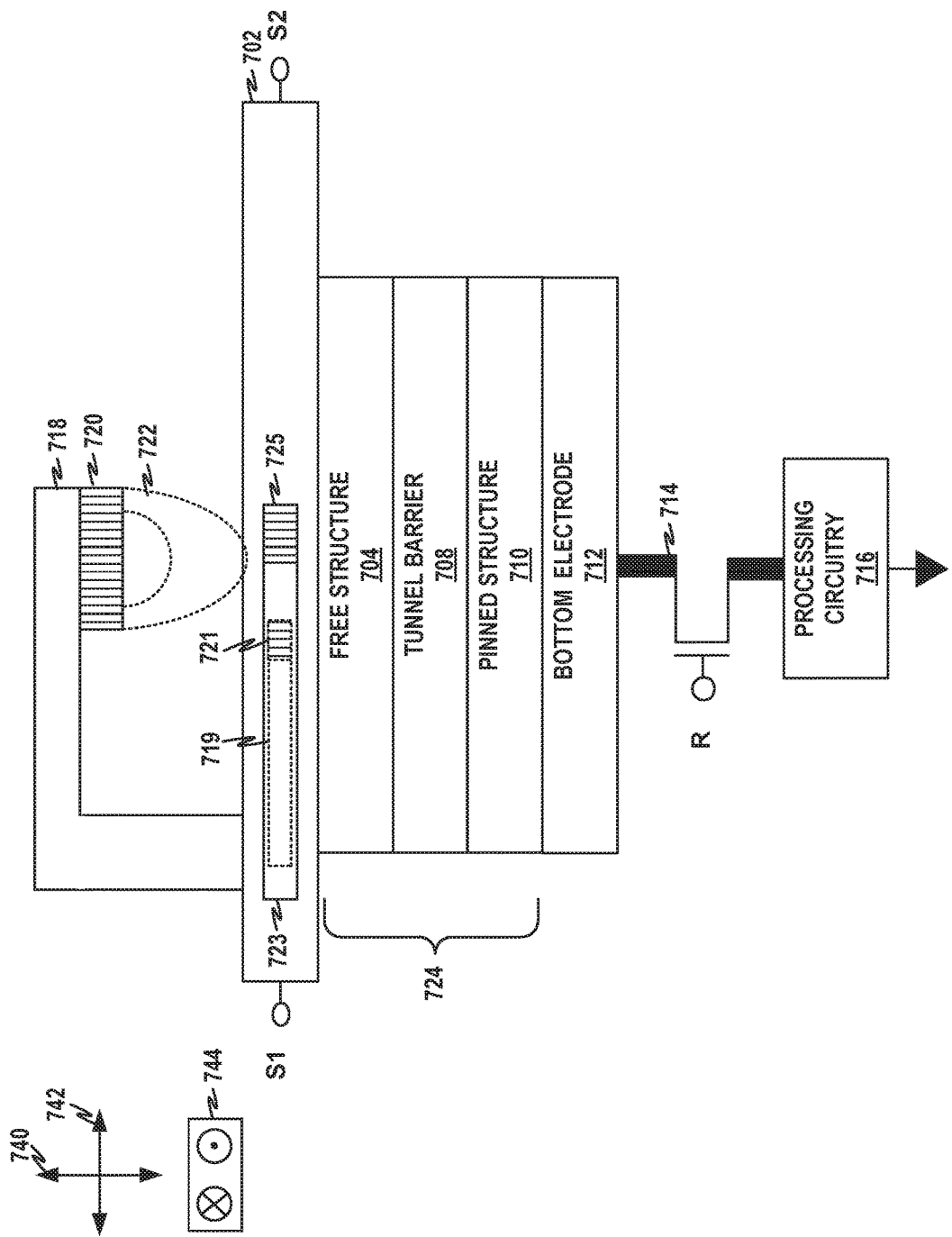

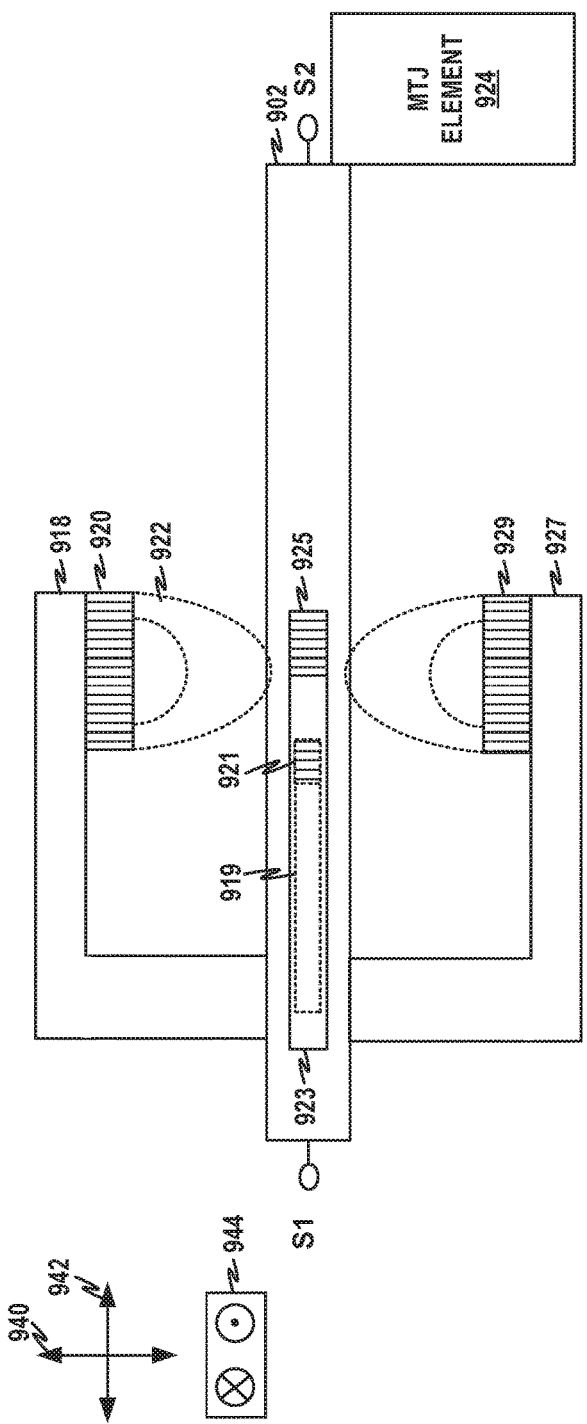

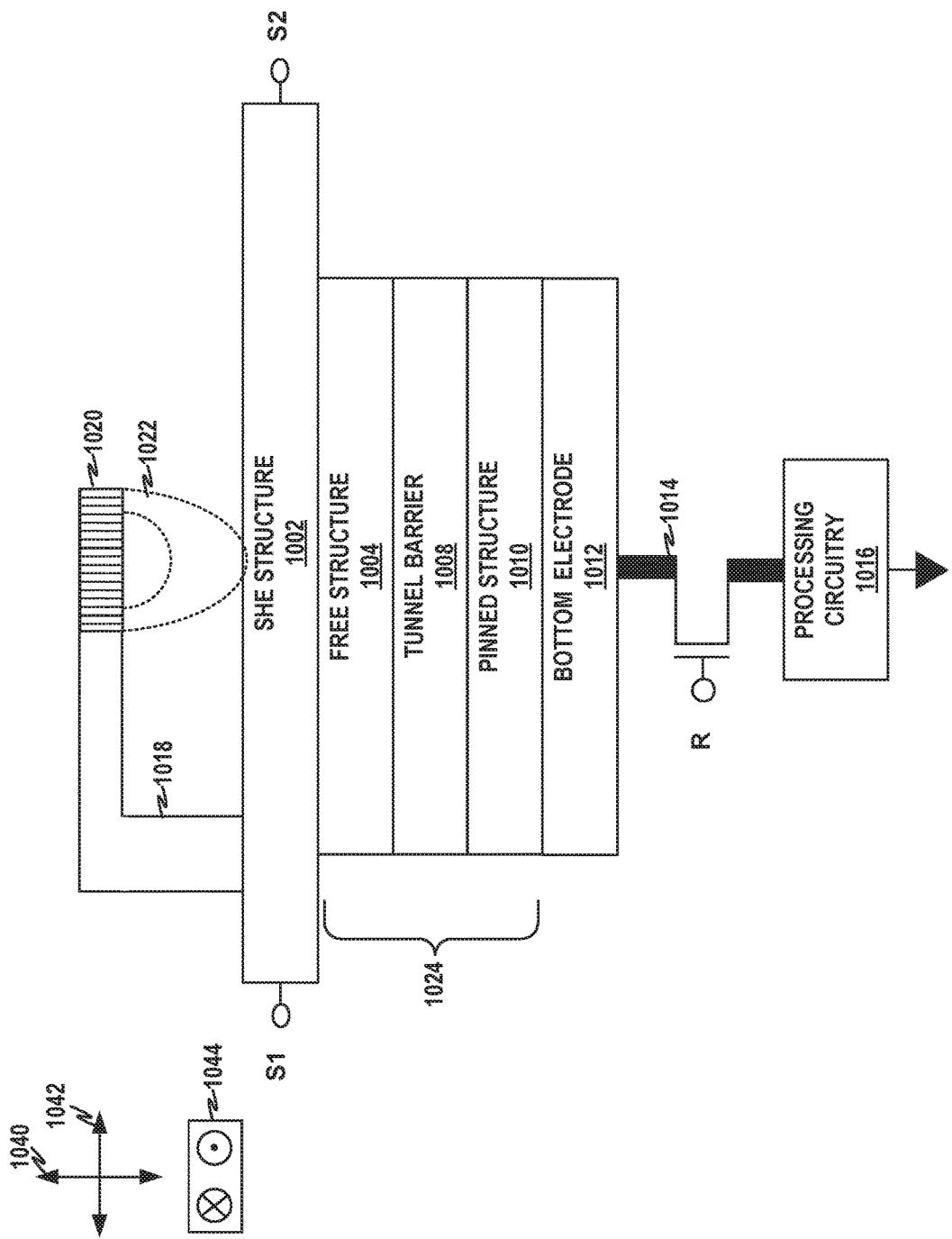

MAGNETIC SPIN HALL EFFECT SPINTRONIC ACCELEROMETER

PRIORITY CLAIM

This application claims the benefit of U.S. Provisional Patent Application No. 62/826,460, filed Mar. 29, 2019, the entire content of which is incorporated herein by reference.

TECHNICAL FIELD

This disclosure relates to sensor devices and, more specifically, to spintronic-based devices that are configured to detect acceleration using a spin Hall effect.

BACKGROUND

Some devices include an accelerometer that monitors acceleration of a device. It is desirable for such devices to detect acceleration of the device to provide context of the device. For example, a position of the device may be controlled based on the acceleration of the device. It is generally desirable for an accelerometer to measure accurately acceleration and to operate in a smaller space. Current types of accelerometers include piezoelectric displacement transducers that generate a voltage when deformed by an acceleration.

SUMMARY

This disclosure generally describes techniques for detecting acceleration using a spintronic-based sensor device and a spin Hall effect. The techniques may in some instances provide for a higher density for a smaller and more lightweight form factor. Furthermore, a spintronic-based sensor device may be more resistant to Electro-Magnetic Interference (EMI) than a piezoelectric displacement transducer, which may be of particular benefit to certain applications.

In one example, a device for detecting acceleration using a spintronic Hall effect includes: a spin Hall effect structure; a Magnetic Tunnel Junction (MTJ) element, the MTJ element comprising a free structure, a pinned structure, and a tunnel barrier arranged between the free structure and the pinned structure; a magnetic structure spaced apart from the spin Hall effect structure such that a magnetic field generated by the magnetic structure is moved relative to the spin Hall effect structure during acceleration; and processing circuitry configured to: generate electrical current through the spin Hall effect structure, measure a resistance at the MTJ element; and determine acceleration based on the resistance at the MTJ element.

In another example, a method for detecting acceleration using a spintronic Hall effect includes: generating, by processing circuitry, electrical current through a spin Hall effect structure, wherein a magnetic structure is spaced apart from the spin Hall effect structure such that a magnetic field generated by the magnetic structure is moved relative to the spin Hall effect structure during acceleration; measuring, by the processing circuitry, a resistance at a Magnetic Tunnel Junction (MTJ) element, the MTJ element comprising a free structure, a pinned structure, and a tunnel barrier arranged between the free structure and the pinned structure, wherein the free structure is arranged with the spin Hall effect structure such that current in the spin Hall effect structure induces spin-torque transfer into the free structure; and determining, by the processing circuitry, acceleration based on the resistance at the MTJ element.

In another example, a device for detecting acceleration using a spintronic Hall effect includes: means for generating electrical current through a spin Hall effect structure, wherein a magnetic structure is spaced apart from the spin Hall effect structure such that a magnetic field generated by the magnetic structure is moved relative to the spin Hall effect structure during acceleration; means for measuring a resistance at a Magnetic Tunnel Junction (MTJ) element, the MTJ element comprising a free structure, a pinned structure, and a tunnel barrier arranged between the free structure and the pinned structure, wherein the free structure is arranged with the spin Hall effect structure such that current in the spin Hall effect structure induces spin-torque transfer into the free structure; and means for determining acceleration based on the resistance at the MTJ element.

The details of one or more aspects of the disclosure are set forth in the accompanying drawings and the description below. Other features, objects, and advantages of the devices, systems, methods, and techniques described in this disclosure will be apparent from the description and drawings, and from the claims.

BRIEF DESCRIPTION OF DRAWINGS

FIG. 1A shows a conceptual illustration of a cross-sectional view of a first Spin Hall Effect (SHE) device configured to detect acceleration using a spin Hall effect.

FIG. 1B shows a conceptual illustration of a top-view of the first SHE device of FIG. 1A.

FIG. 1D shows a conceptual illustration of a cross-sectional view of the first SHE device of FIG. 1A during an acceleration in a second direction.

FIG. 3B shows a conceptual illustration of a top-view of the third SHE device of FIG. 3A.

FIG. 6A shows a conceptual illustration of a cross-sectional view of a sixth SHE device configured to detect acceleration using a spin Hall effect.

FIG. 7A shows a conceptual illustration of a cross-sectional view of a seventh SHE device configured to detect acceleration using a spin Hall effect.

FIG. 9A shows a conceptual illustration of a cross-sectional view of a ninth SHE device configured to detect acceleration using a spin Hall effect.

FIG. 10A shows a conceptual illustration of a cross-sectional view of a tenth SHE device configured to detect acceleration using a spin Hall effect.

DETAILED DESCRIPTION

Figure 1C:
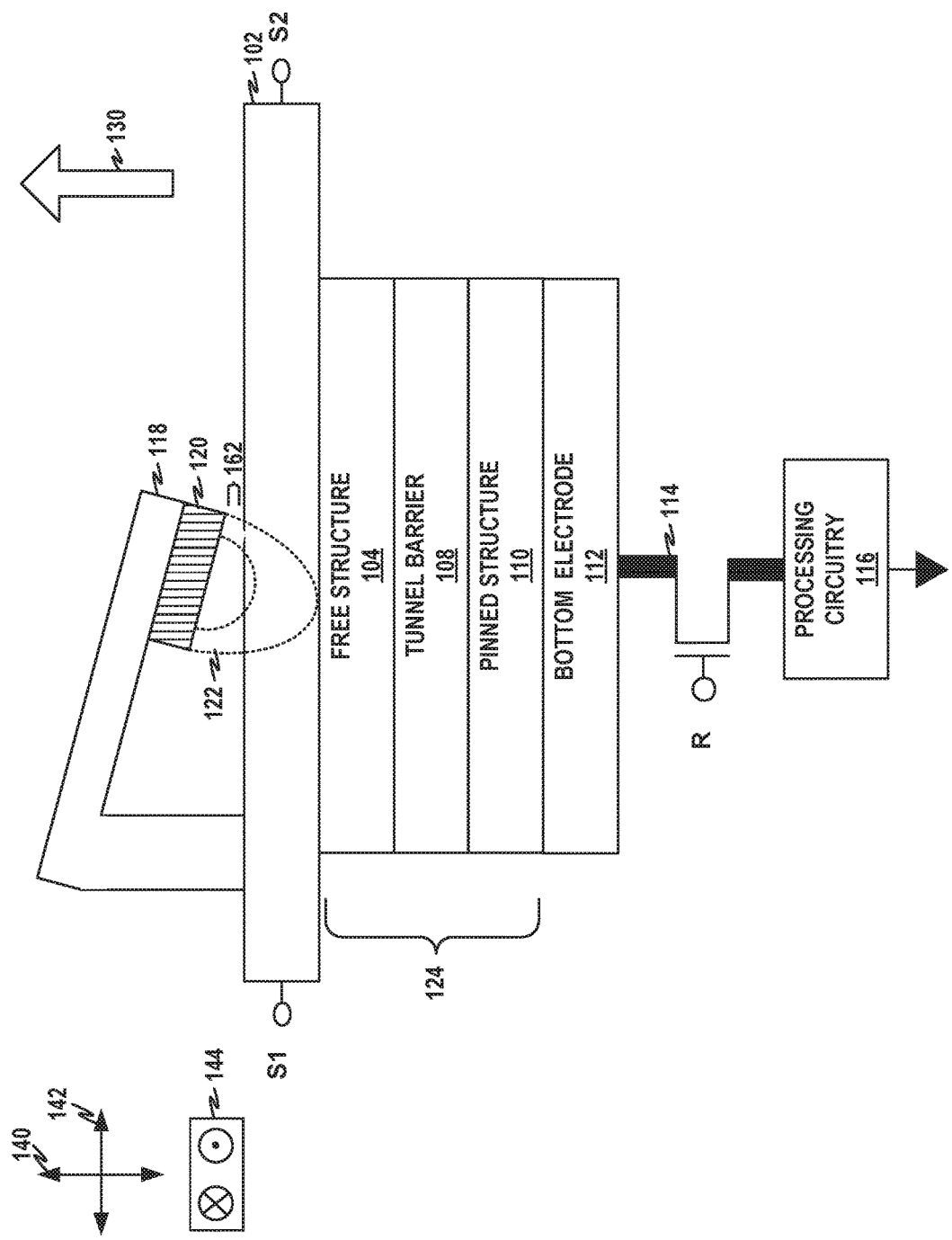
FIG. 1C shows a conceptual illustration of a cross-sectional view of the first SHE device of FIG. 1A during an acceleration in a first direction.

Some applications have been identified in which miniaturized sensing devices are needed for operation in unique environments. Such sensing devices may be configurable for strategic applications. For example, such sensing devices may be radiation-hardened, and include magnetically-based devices that can be integrated (e.g., monolithically and, in particular, initially) into a compact module with Application-Specific Integrated Circuits (ASICs) including those that contain embedded Magnetoresistive Random Access Memory (MRAM) bits. Of various sensing devices of interest, one device of interest that is discussed here is an acceleration sensor device that makes use of magnetic spintronic technology and the Spin Hall Effect (SHE) and could be used with or separately from other sensors (e.g., a gyroscope, a mechanical shock and vibration sensor, etc.), and that may support compatibility with MRAM technology.

In accordance with one or more techniques described herein, circuitry may be constructed to include a SHE structure in proximity to a cantilevered magnet on a cantilever that responds to acceleration, and to a Magnetic Tunnel Junction (MTJ) that detects and supports read-out (e.g., using spin diffusion and spin transfer for writing), with associated electronics and with desired, resistance, resistance-area product, and dimensions. Anisotropic, Giant, and/or Tunneling Magneto-Resistive effects may be used for sensing and readback. The SHE and spin ordering (e.g., induced by spin diffusion and spin-orbit torque (Spin Orbit Torque, or SOT, processes) can be disrupted by the magnetic field from the magnet, which is the effect to be sensed with high-sensitivity and high-signal magnetoresistance, beyond low-capacitance signals.

Within a tunnel barrier structure between two magnetic layers of the MTJ, techniques described herein may include one or more test masses (e.g., one or more free structures), which are ferromagnetic or contain ferromagnetic components, that can be placed in a MEMS (micro-electro-mechanical systems) structure or suspended or cantilevered to respond to acceleration. Processing circuitry may make use electrical, electronic, or spintronic current(s). Tunneling current(s) can be spin-dependent or spin-independent, and ballistic electron tunneling may be used. Anisotropic, Giant, and/or Tunneling Magneto-Resistive effects may be used for sensing acceleration.

For example, a magnetic structure may flex towards and/or away from a Spin Hall Effect (SHE) layer in response to acceleration. Such flexing of the magnetic structure relative to the SHE structure may move a magnetic field to change a spin-torque transfer in a free structure of a MTJ element, which causes a corresponding change in resistance of the MTJ element. In this way, processing circuitry may detect acceleration using the resistance of the MTJ element. As used in this disclosure, the term acceleration may refer to both positive acceleration and negative acceleration. Negative acceleration is also sometimes referred to as deceleration. Depending on the implementation of the sensor device, a magnetic structure may flex towards a SHE structure in the presence of one of positive acceleration or negative acceleration and flex away from the SHE structure in the presence of the other positive acceleration or negative acceleration.

Such magnetic/spintronic devices may provide unique and desired application functionality, customization prospects, and environmental capability (e.g., shock, vibration, radiation, acceleration, motion) for various environments. Such magnetic/spintronic devices may offer materials and technological similarity and compatibility with MRAM bits and other sensing devices such as accelerometers, gyros, and pressure sensors, which may support integration, modularity, miniaturization, and packaging with embedded MRAM and ASICS. In some examples, the spintronic-based accelerometer described herein may be used for die-to-die or monolithic integration with MTJs/MTJ die.

FIG. 1A shows a conceptual illustration of a cross-sectional view of a first SHE device 100 configured to detect acceleration using a spin Hall effect. SHE device 100 includes SHE structure 102, free structure 104, tunnel barrier 108, pinned structure 110, bottom electrode 112, switching element 114, processing circuitry 116, support structure 118, and magnetic structure 120. In this disclosure, a "layer" may include a set of one or more structures (which may also be referred to herein as "sub-structures") and/or a set of one or more layers (which may also be referred to herein as "sub-layers") and a "structure" may similarly include a set of one or more structures (which may also be referred to herein as "sub-structures") and/or a set of one or more layers (which may also be referred to herein as "sub-layers"). However, for clarity, structure is generally used herein to refer to a set of one or more layers and a layer is generally used herein to refer to a portion within a structure.

As shown in FIG. 1A, support structure 118 extends from SHE structure 102 along vertical direction 140 such that magnetic structure 120 is spaced apart from SHE structure 102 along vertical direction 140. As shown, magnetic structure 120 is arranged between support structure 118 and SHE structure 102. However, in other examples, the magnetic structure may be attached to a side surface of the support structure. In the example of FIG. 1A, current flows along first horizontal direction 142. For instance, current may flow from S1 to S2 or current may flow from S2 to S1. Second horizontal direction 144 is perpendicular to first horizontal direction 142 and vertical direction 140.

SHE structure 102 may be formed of an antiferromagnetic material such as, for example, but not limited to, platinum manganese (PtMn), iron-manganese (FeMn), iridium manganese (IrMn), palladium manganese (PdMn), or another antiferromagnetic material. As shown, SHE structure 102 may include a first node (S1) and a second node (S2) for receiving current (e.g., from a current source).

Support structure 118 may be formed of silicon, silicon nitride, silicon oxide, copper, aluminum, aluminum oxide, magnesium oxide, or other material(s). As shown, support structure 118 may be configured to arrange magnetic structure 120 at distance 160 from SHE structure 102 during no acceleration of SHE device 100.

Magnetic structure 120 may represent a component configured to generate a magnetic field 122. Magnetic structure 120 may be include, for example, but not limited to, a cobalt alloy (Co-alloy) and/or a nickel iron (NiFe). Magnetic structure 120 may include, for example, but not limited to, a metal and/or a metal/ferromagnetic metal system. For instance, magnetic structure 120 may be formed of a metal or metal/ferromagnetic metal system on Silicon Oxide (SiOx), Silicon Nitride (SiNx), and/or Silicon (Si).

MTJ element 124 includes free structure 104, tunnel barrier 108, and a pinned structure 110. Free structure 104 may include a magnetization direction that is free to switch between a parallel orientation and an antiparallel orientation. Tunnel barrier 108 includes a non-magnetic metal that separates free structure 104 and pinned structure 110. In some examples, tunnel barrier 108 may be formed of aluminum oxide, magnesium oxide, or another material. Pinned structure 110 may include a magnetization direction that is fixed or "pinned" to a single orientation. For example, pinned structure 110 may be pinned in a parallel orientation. In other examples, pinned structure 110 may be pinned in an antiparallel orientation. In the example of FIG. 1A, pinned structure 110 may include an anti-ferromagnetic layer, such that the magnetization direction of the pinned structure 110 is "pinned" in a particular orientation the magnetization direction of the pinned structure 110 remains relatively fixed when operational magnetic fields are applied to MTJ element 124. In the example of FIG. 1A, a top surface of free structure 104 is directly adjacent to SHE structure 102 and a bottom surface of free structure 104 is directly adjacent to tunnel barrier 108. In other examples, however, a side surface of free structure 104 may be directly adjacent to SHE structure 102 and a bottom surface of free structure 104 is directly adjacent to tunnel barrier 108.

Bottom electrode 112 may be formed of a conductive material to permit a connection to MTJ element 124. Examples of conductive materials may include, but are not limited to, copper.

Switching element 114 may be configured to operate in a first state (e.g., switched-in) that generates an electrical channel coupling bottom electrode 112 to processing circuitry 116 and in a second state (e.g., switched-out) that refrains from generating the electrical channel coupling bottom electrode 112 to processing circuitry 116. Examples of switching element 114 may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. It should be understood that switching elements may be high-side or low-side switching elements. Additionally, switching elements may be voltage-controlled and/or current-controlled. Examples of current-controlled switching elements may include, but are not limited to, gallium nitride (GaN) MOSFETs, BJTs, or other current-controlled elements.

Processing circuitry 116 include metallization and/or integrated circuitry (e.g., Complementary metal-oxide-semiconductor (CMOS)). Processing circuitry 116 may include an analog circuit. In some examples, processing circuitry 116 may include a microcontroller on a single integrated circuit containing a processor core, memory, inputs, and outputs. For example, processing circuitry 116 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, processing circuitry 116 include a combination of one or more analog components and one or more digital components.

In the example of FIG. 1A, processing circuitry 116 may use a magnetization direction of free structure 104 to detect an acceleration of SHE device 100. For example, processing circuitry 116 may detect a magnitude and/or direction of acceleration using a resistance and/or magnetoresistance of MTJ element 124. Given charge current between S1 and S2 of SHE structure 102, the SHE produces spin ordering that results in spin diffusion and then spin accumulation. For example, processing circuitry 116 may include or cause a current source to provide the charge current between S1 and S2 of SHE structure 102. The spin accumulation is a consequence of the spin current induced in the SHE structure 102 and leads to an accumulation of electrons at a surface of the SHE structure 102 with a common spin state (e.g., spin up or spin down states). The accumulated spins are transferred into free structure 104, which induce magnetic precession and/or magnetic switching of a magnetization direction of free structure 104.

Increasing the magnetic field 122 into SHE structure 102 weakens the spin ordering in SHE structure 102, which therefore reduces spin diffusion and results in lower spin accumulation. The lower spin accumulation results in less spin transfer to free structure 104 and therefore a smaller induction of magnetic precession and a corresponding smaller modulation in a magneto-resistance of MTJ element 124. Similarly, decreasing magnetic field 122 into SHE structure 102 supports and/or increases the spin ordering in SHE structure 102, which therefore maintains and/or increases spin diffusion and results in consistent and/or increased spin accumulation. The higher spin accumulation results in higher spin transfer to free structure 104 and therefore a higher induction of magnetic precession and/or magnetic switching. The higher spin accumulation results in higher spin transfer to free structure 104 and therefore a higher induction of magnetic precession and a corresponding higher modulation in a magneto-resistance of MTJ element 124. Processing circuitry 116 may use the modulation in a magneto-resistance of MTJ element 124 to detect a magnitude and/or direction of acceleration. In this manner, SHE structure 102 and MTJ element 124 may be used as an accelerometer.

While the example of FIG. 1A includes one combination of support structure 118 and magnetic structure 120 in other examples, a SHE device may include more than one (e.g., 2, 3, 4, etc.) support structure and/or magnetic structure. Additionally, while magnetic structure 120 is arranged between an arm of support structure 118 and SHE structure 102, in other examples, magnetic structure 120 may be arranged differently with support structure 118 and SHE structure 102. For example, magnetic structure 120 may be arranged on a side portion of support structure 118 such that magnetic structure 120 is not arranged between an arm of support structure 118 and SHE structure 102. Although the example of FIG. 1A illustrates a top portion of free structure 104 being adjacent to SHE structure 102, in other examples, a side portion of free structure 104 may be adjacent to SHE structure 102.

SHE device 100 may detect and support read-out (e.g., using spin diffusion and spin transfer for writing) with a larger signal-to-noise ratio compared to detectors relying on capacitive elements, particularly as a size of a device decreases. For example, as a size of a SHE device decreases, a resistance of the SHE device increases, which results in a corresponding increase in amplitude of a voltage signal for the SHE device. As such, SHE device 100 may generate a signal that can be made large for excitation, sensing, and signal processing, and scales favorably. For SHE devices, a device resistance, magneto-resistance, applied voltage, sense currents, magnetic source field, geometry, gradient, components, magnitude, and distance may be selectable parameters.

FIG. 1B shows a conceptual illustration of a top-view of first SHE device 100 of FIG. 1A. In the example of FIG. 1B, support structure 118 and magnetic structure 120 are arranged above top surface 150 of SHE structure 102 and MTJ element 124 is arranged below bottom surface 154 of SHE structure 102.

FIG. 1C shows a conceptual illustration of a cross-sectional view of first SHE device 100 of FIG. 1A during an acceleration in first direction 130. Support structure 118 may be adapted to flex magnetic structure 120 toward SHE structure 102 during acceleration. As shown, acceleration in first direction 130 causes a flexing in support structure 118 such that magnetic structure 120 is spaced apart from SHE structure 102 by distance 162 during acceleration, which is less than distance 160 during constant velocity (e.g., no acceleration). As such, processing circuitry 116 may detect an increase in a resistance and/or magnetoresistance of MTJ element 124.

FIG. 1D shows a conceptual illustration of a cross-sectional view of first SHE device 100 of FIG. 1A during an acceleration in second direction 132. Support structure 118 may be adapted to flex magnetic structure 120 away from SHE structure 102 during acceleration. As shown, acceleration in second direction 132 causes a flexing in support structure 118 such that magnetic structure 120 is spaced apart from SHE structure 102 by distance 164 during acceleration, which is more than distance 160 during constant velocity (e.g., no acceleration). As such, processing circuitry 116 may detect an decrease in a resistance and/or magnetoresistance of MTJ element 124.

Figure 2A:
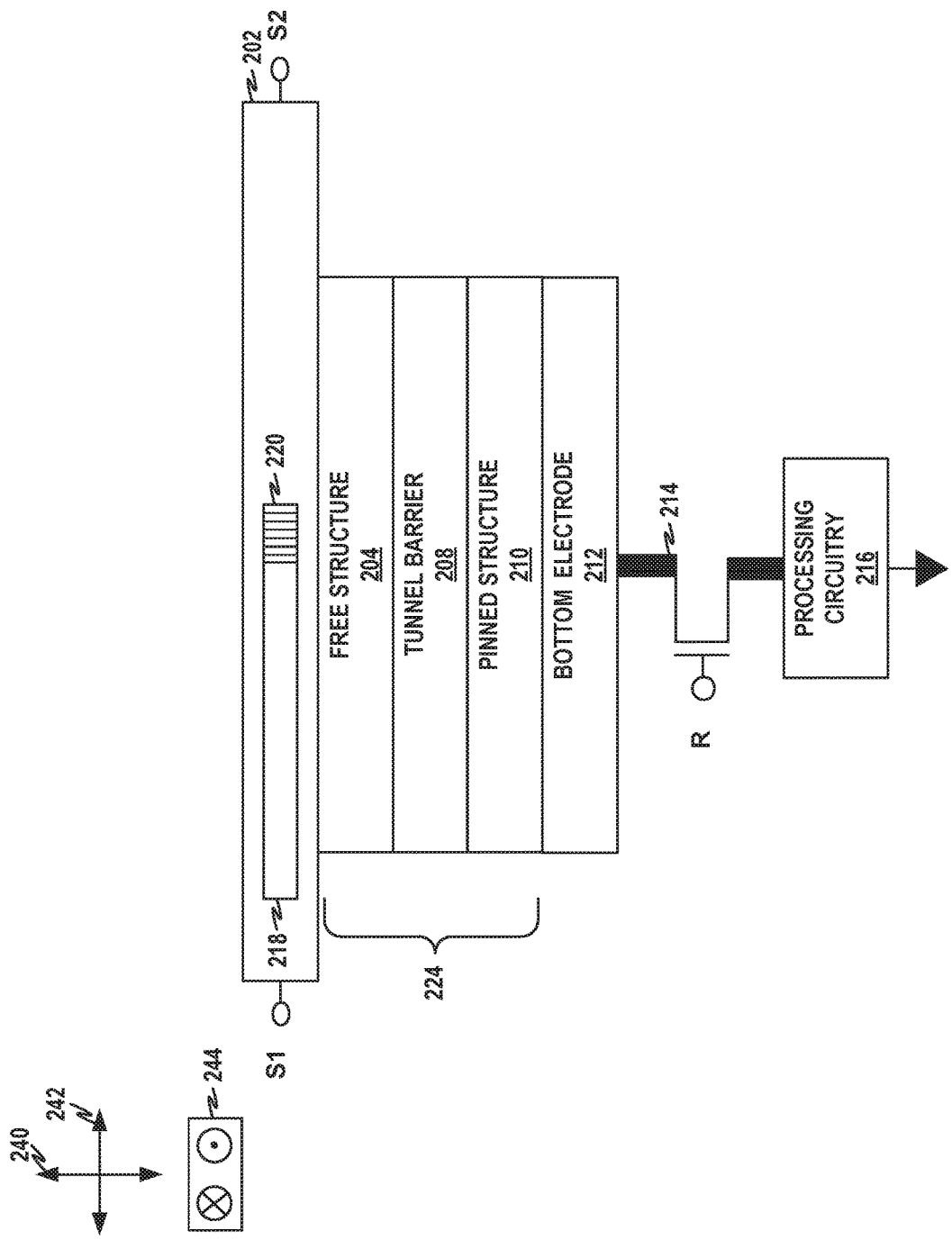
FIG. 2A shows a conceptual illustration of a cross-sectional view of a second SHE device configured to detect acceleration using a spin Hall effect.

FIG. 2A shows a conceptual illustration of a cross-sectional view of a second SHE device 200 configured to detect acceleration using a spin Hall effect. SHE device 200 includes SHE structure 202, free structure 204, tunnel barrier 208, pinned structure 210, bottom electrode 212, switching element 214, processing circuitry 216, support structure 218, and magnetic structure 220, which may be examples of SHE structure 102, free structure 104, tunnel barrier 108, pinned structure 110, bottom electrode 112, switching element 114, processing circuitry 116, support structure 118, and magnetic structure 120 of FIG. 1A, respectively. In the example of FIG. 2A, current flows along first horizontal direction 242. For instance, current may flow from S1 to S2 or current may flow from S2 to S1. Second horizontal direction 244 is perpendicular to first horizontal direction 142 and vertical direction 140. In the example of FIG. 2A, support structure 218 and magnetic structure 220 are arranged on a side surface of SHE structure 202.

Figure 2B:
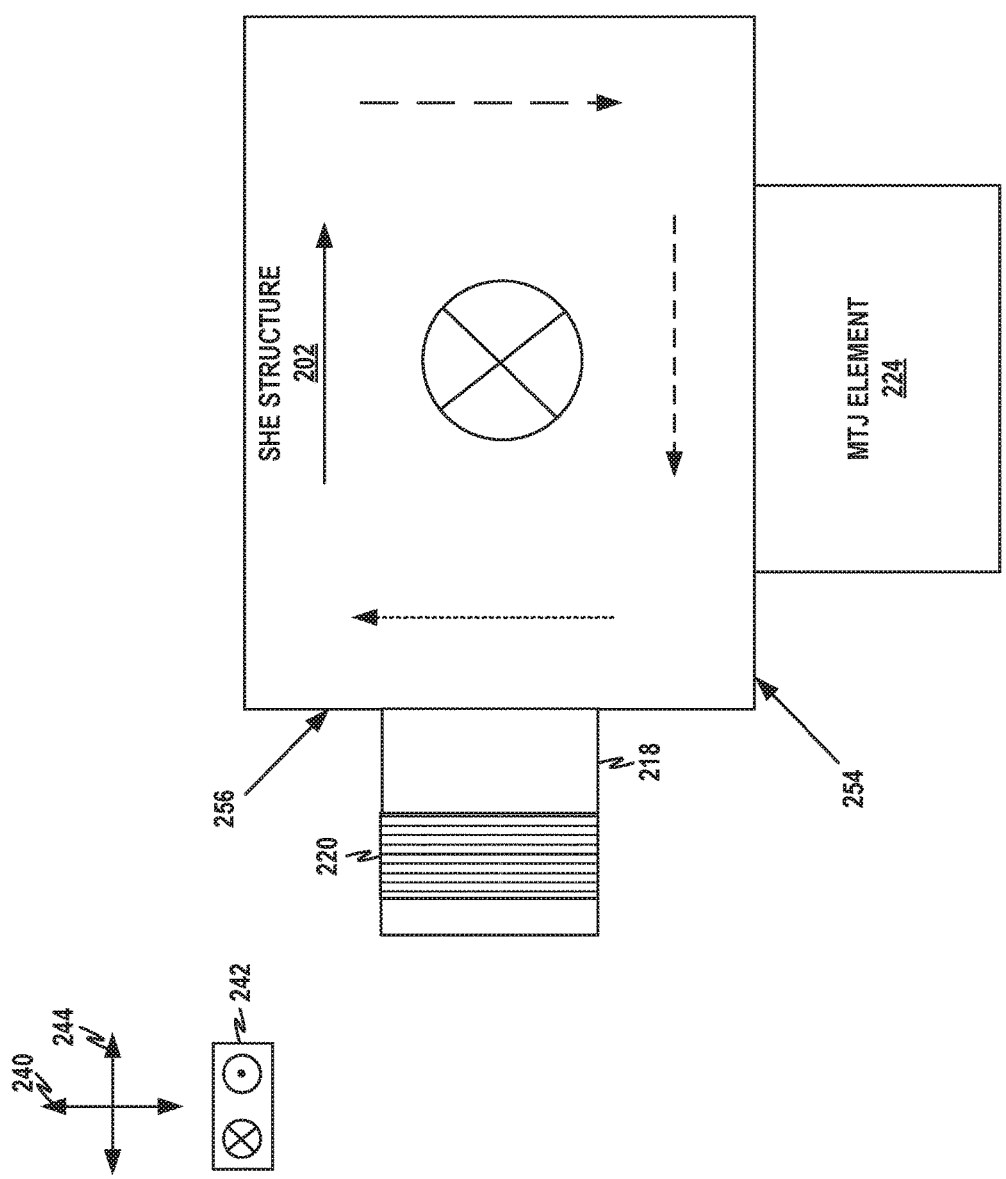
FIG. 2B shows a conceptual illustration of a top-view of the second SHE device of FIG. 2A.

FIG. 2B shows a conceptual illustration of a top-view of second SHE device 200 of FIG. 2A. In the example of FIG. 2B, support structure 218 and magnetic structure 220 are arranged with a side surface 256 of SHE structure 202 and MTJ element 224 is arranged below bottom surface 254 of SHE structure 202. In the example of FIG. 2B, side surface 256 is adjacent to bottom surface 254. For instance, side surface 256 is adjacent to bottom surface 254 at a corner of SHE structure 202.

Figure 3A:
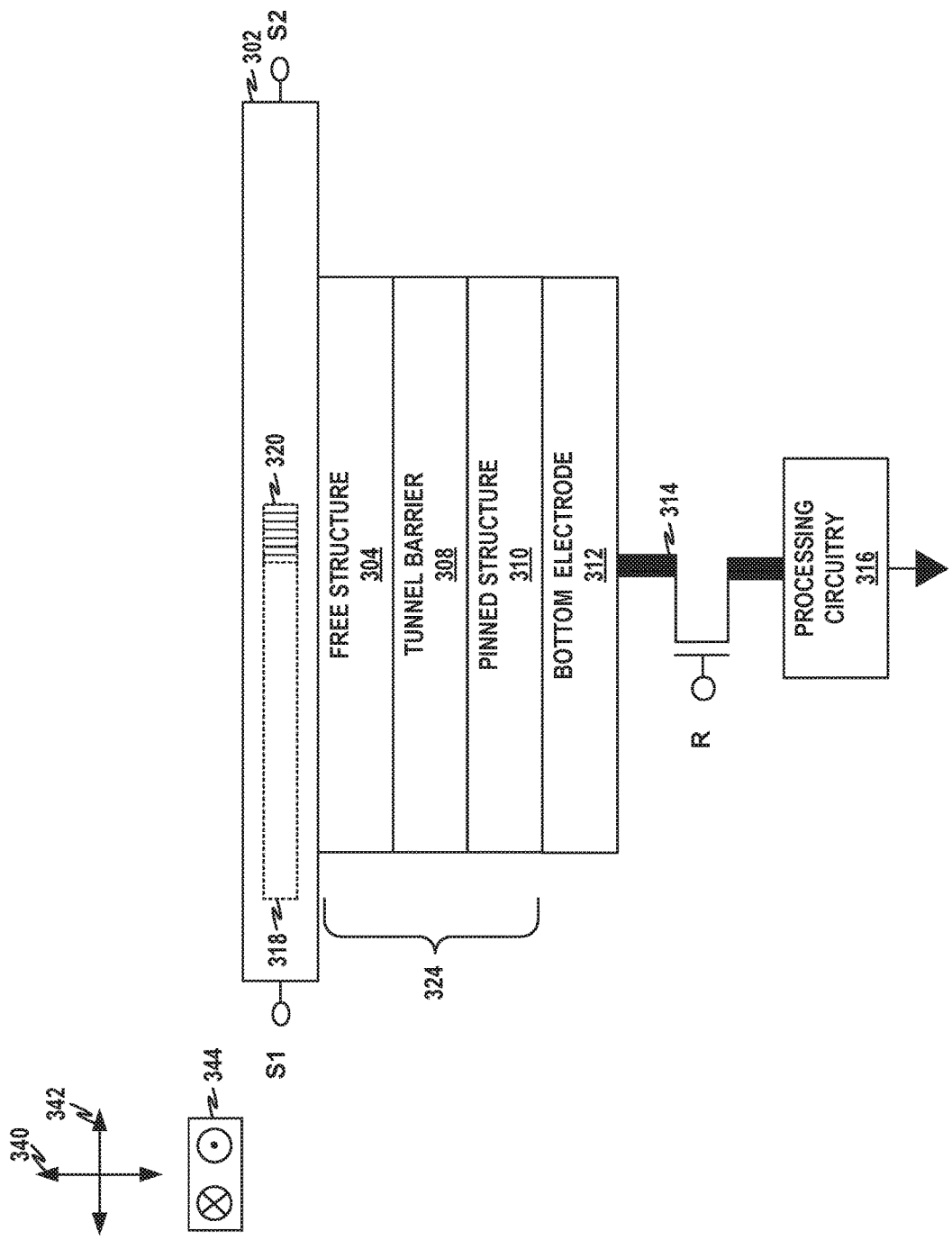
FIG. 3A shows a conceptual illustration of a cross-sectional view of a third SHE device configured to detect acceleration using a spin Hall effect.

FIG. 3A shows a conceptual illustration of a cross-sectional view of a third SHE device 300 configured to detect acceleration using a spin Hall effect. SHE device 300 includes SHE structure 302, free structure 304, tunnel barrier 308, pinned structure 310, bottom electrode 312, switching element 314, processing circuitry 316, support structure 318, and magnetic structure 320, which may be examples of SHE structure 102, free structure 104, tunnel barrier 108, pinned structure 110, bottom electrode 112, switching element 114, processing circuitry 116, support structure 118, and magnetic structure 120 of FIG. 1A, respectively. In the example of FIG. 3A, current flows along first horizontal direction 342. For instance, current may flow from S1 to S2 or current may flow from S2 to S1. Second horizontal direction 344 is perpendicular to first horizontal direction 342 and vertical direction 340. In the example of FIG. 3A, support structure 318 and magnetic structure 320 are arranged on a side surface of SHE structure 302.

FIG. 3B shows a conceptual illustration of a top-view of the third SHE device 300 of FIG. 3A. In the example of FIG. 3B, support structure 318 and magnetic structure 320 are arranged with a side surface 352 of SHE structure 302 and MTJ element 324 is arranged below bottom surface 354 of SHE structure 302.

Figure 4A:
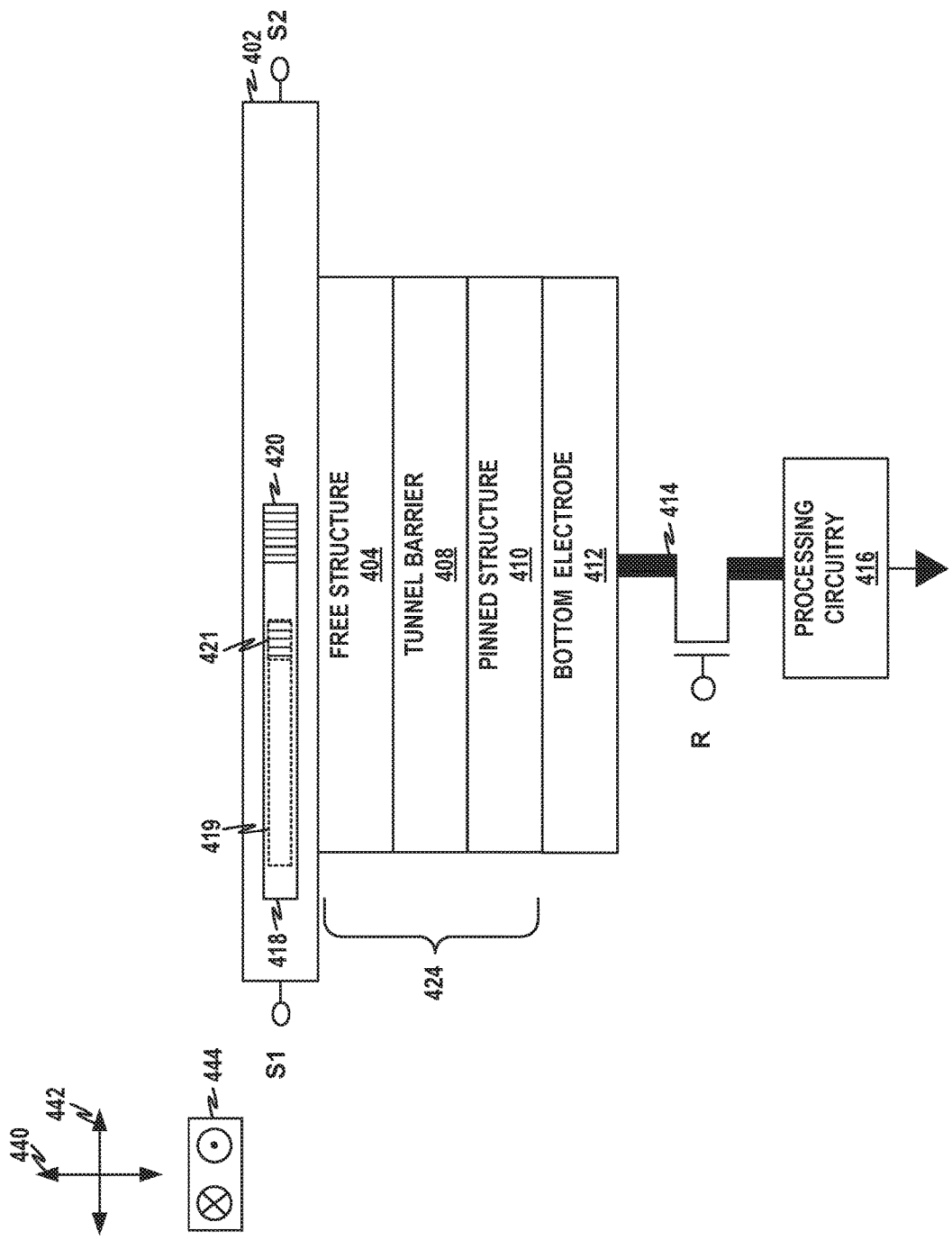
FIG. 4A shows a conceptual illustration of a cross-sectional view of a fourth SHE device configured to detect acceleration using a spin Hall effect.

FIG. 4A shows a conceptual illustration of a cross-sectional view of a fourth SHE device 400 configured to detect acceleration using a spin Hall effect. SHE device 400 includes SHE structure 402, free structure 404, tunnel barrier 408, pinned structure 410, bottom electrode 412, switching element 414, processing circuitry 416, support structure 418, and magnetic structure 420, which may be examples of SHE structure 102, free structure 104, tunnel barrier 108, pinned structure 110, bottom electrode 112, switching element 114, processing circuitry 116, support structure 118, and magnetic structure 120 of FIG. 1A, respectively.

Additionally, SHE device 400 includes support structure 419 and magnetic structure 421, which may be examples of support structure 118 and magnetic structure 120 of FIG.

1A, respectively. For example, support structure 419 may space apart magnetic structure 421 from SHE structure 402 such that a magnetic field generated by magnetic structure 421 is moved relative to SHE structure 402 during acceleration.

FIG. 4A illustrates support structure 419 and magnetic structure 421 with dashed lines to indicate support structure 419 and magnetic structure 421 are arranged on an opposite side of SHE structure 402 than the side of SHE structure 402 shown. In the example of FIG. 4A, current flows along first horizontal direction 442. For instance, current may flow from S1 to S2 or current may flow from S2 to S1. Second horizontal direction 444 is perpendicular to first horizontal direction 442 and vertical direction 440. In the example of FIG. 4A, support structure 418 and magnetic structure 420 are arranged on a first side surface of SHE structure 402 and support structure 419 and magnetic structure 421 are arranged on a second side surface of SHE structure 402.

In the example of FIG. 4A, an acceleration along direction 444 may be detected using magnetic fields applied by both magnetic structure 420 and magnetic structure 421. For example, MTJ element 424 may detect a first change in resistance resulting from a magnetic field from magnetic structure 420 being arranged closer to SHE structure 102 in response to a first acceleration (e.g., into the page) in direction 444 and detect no change in resistance resulting from a magnetic field from magnetic structure 421 in response to the first acceleration.

In this example, MTJ element 424 may detect a second change in resistance resulting from a magnetic field from magnetic structure 421 being arranged closer to SHE structure 102 in response to a second acceleration (e.g., out of the page) in direction 444 and detect no change in resistance resulting from a magnetic field from magnetic structure 420 in response to the first acceleration. Using two magnetic structures to measure positive and negative acceleration along a direction may provide improved accuracy and sensitivity compared to systems using only one magnetic structure to measure both positive and negative acceleration along the direction.

Figure 4B:
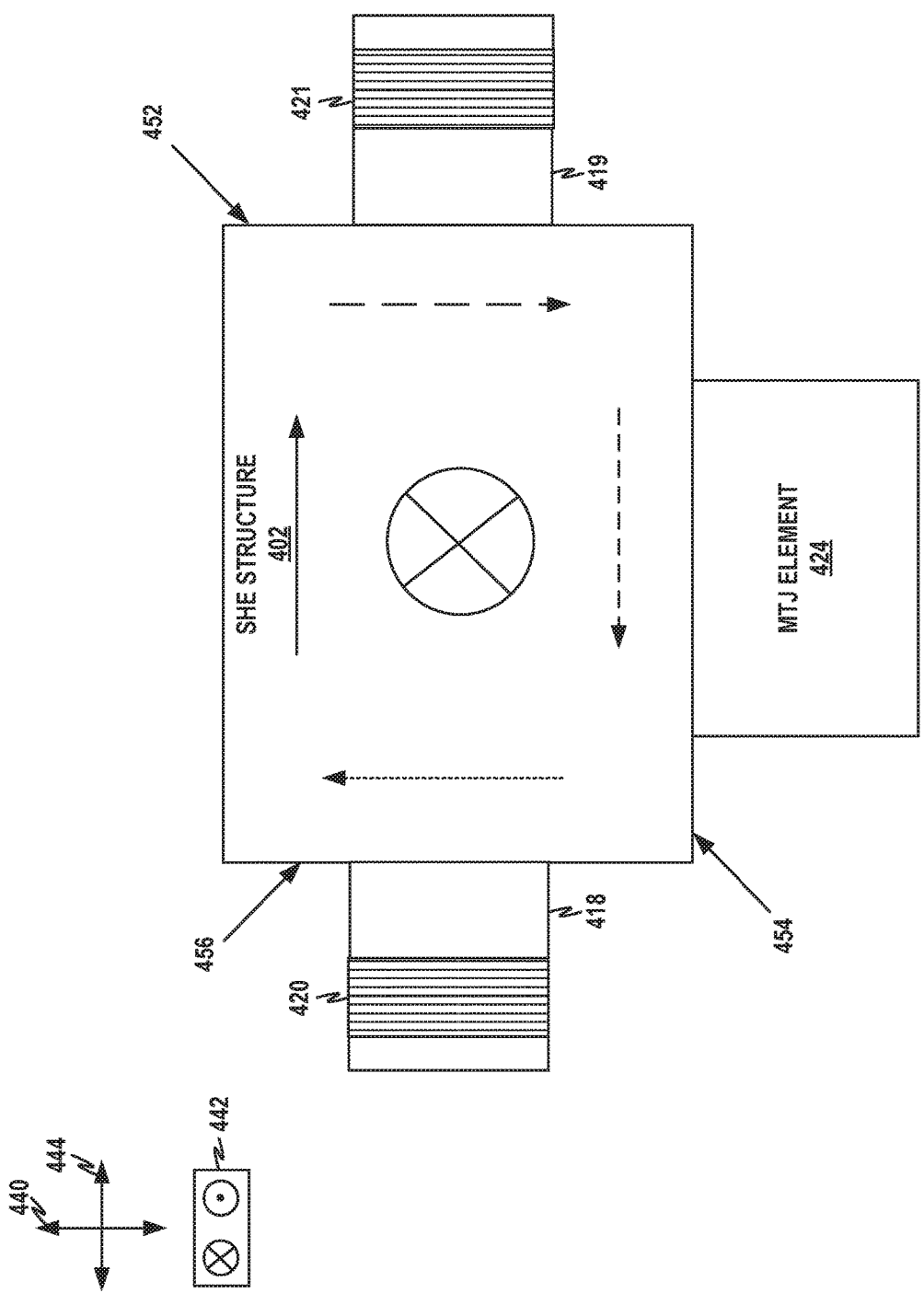
FIG. 4B shows a conceptual illustration of a top-view of the fourth SHE device of FIG. 4A.

FIG. 4B shows a conceptual illustration of a top-view of the fourth SHE device 400 of FIG. 4A. In the example of FIG. 4B, support structure 418 and magnetic structure 420 are arranged with side surface 456 of SHE structure 402, support structure 419 and magnetic structure 421 are arranged with side surface 452 of SHE structure 402, and MTJ element 424 is arranged below bottom surface 454 of SHE structure 402. In the example of FIG. 4B, side surface 456 and side surface 452 are adjacent to bottom surface 454. For instance, side surface 456 is adjacent to bottom surface 454 at a corner of SHE structure 402 and side surface 452 is adjacent to bottom surface 454 at a corner of SHE structure 402.

Figure 5A:
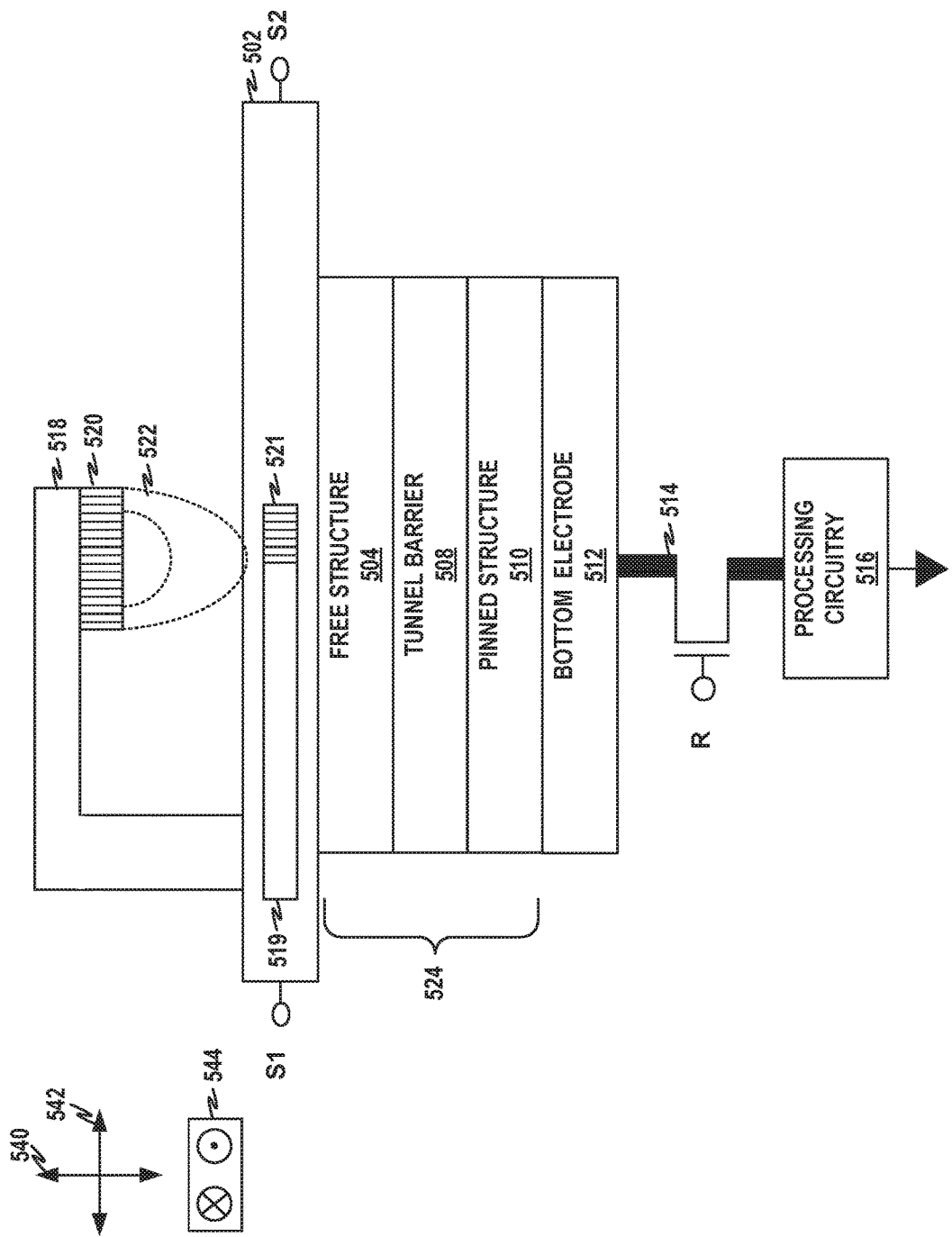
FIG. 5A shows a conceptual illustration of a cross-sectional view of a fifth SHE device configured to detect acceleration using a spin Hall effect.

FIG. 5A shows a conceptual illustration of a cross-sectional view of a fifth SHE device 500 configured to detect acceleration using a spin Hall effect. SHE device 500 includes SHE structure 502, free structure 504, tunnel barrier 508, pinned structure 510, bottom electrode 512, switching element 514, processing circuitry 516, support structure 518, and magnetic structure 520, which may be examples of SHE structure 102, free structure 104, tunnel barrier 108, pinned structure 110, bottom electrode 112, switching element 114, processing circuitry 116, support structure 118, and magnetic structure 120 of FIG. 1A, respectively. Additionally, SHE device 500 includes support structure 519 and magnetic structure 521, which may be examples of support structure 118 and magnetic structure 120 of FIG. 1A, respectively. In the example of FIG. 5A, current flows along first horizontal direction 542. For instance, current may flow from S1 to S2 or current may flow from S2 to S1. Second horizontal direction 544 is perpendicular to first horizontal direction 542 and vertical direction 540. In the example of FIG. 5A, support structure 518 and magnetic structure 520 are arranged on a top surface of SHE structure 502 and support structure 519 and magnetic structure 521 are arranged on a side surface of SHE structure 502.

Figure 5B:
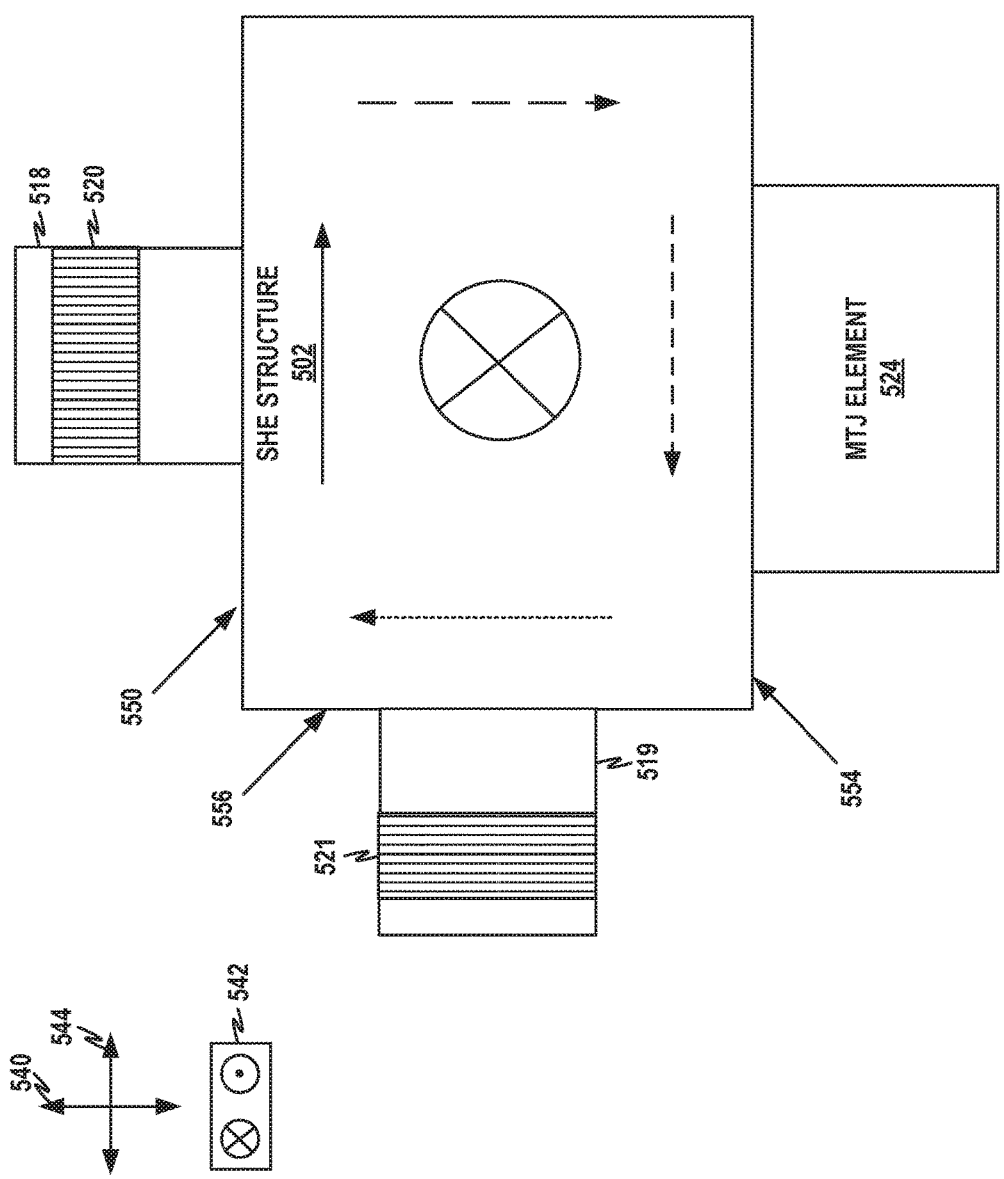
FIG. 5B shows a conceptual illustration of a top-view of the fifth SHE device of FIG. 5A.

FIG. 5B shows a conceptual illustration of a top-view of the fifth SHE device 500 of FIG. 5A. In the example of FIG. 5B, support structure 518 and magnetic structure 520 are arranged with top surface 550 of SHE structure 502, support structure 519 and magnetic structure 521 are arranged with side surface 556 of SHE structure 502 and MTJ element 524 is arranged below bottom surface 554 of SHE structure 502.

FIG. 6A shows a conceptual illustration of a cross-sectional view of a sixth SHE device 600 configured to detect acceleration using a spin Hall effect. SHE device 600 includes SHE structure 602, free structure 604, tunnel barrier 608, pinned structure 610, bottom electrode 612, switching element 614, processing circuitry 616, support structure 618, and magnetic structure 620, which may be examples of SHE structure 102, free structure 104, tunnel barrier 108, pinned structure 110, bottom electrode 112, switching element 114, processing circuitry 116, support structure 118, and magnetic structure 120 of FIG. 1A, respectively. Additionally, SHE device 600 includes support structure 619 and magnetic structure 621, which may be examples of support structure 118 and magnetic structure 120 of FIG. 1A, respectively. In the example of FIG. 6A, current flows along first horizontal direction 642. For instance, current may flow from S1 to S2 or current may flow from S2 to S1. Second horizontal direction 644 is perpendicular to first horizontal direction 642 and vertical direction 640. In the example of FIG. 6A, support structure 618 and magnetic structure 620 are arranged on a top surface of SHE structure 602 and support structure 619 and magnetic structure 621 are arranged on a side surface of SHE structure 602.

Figure 6B:
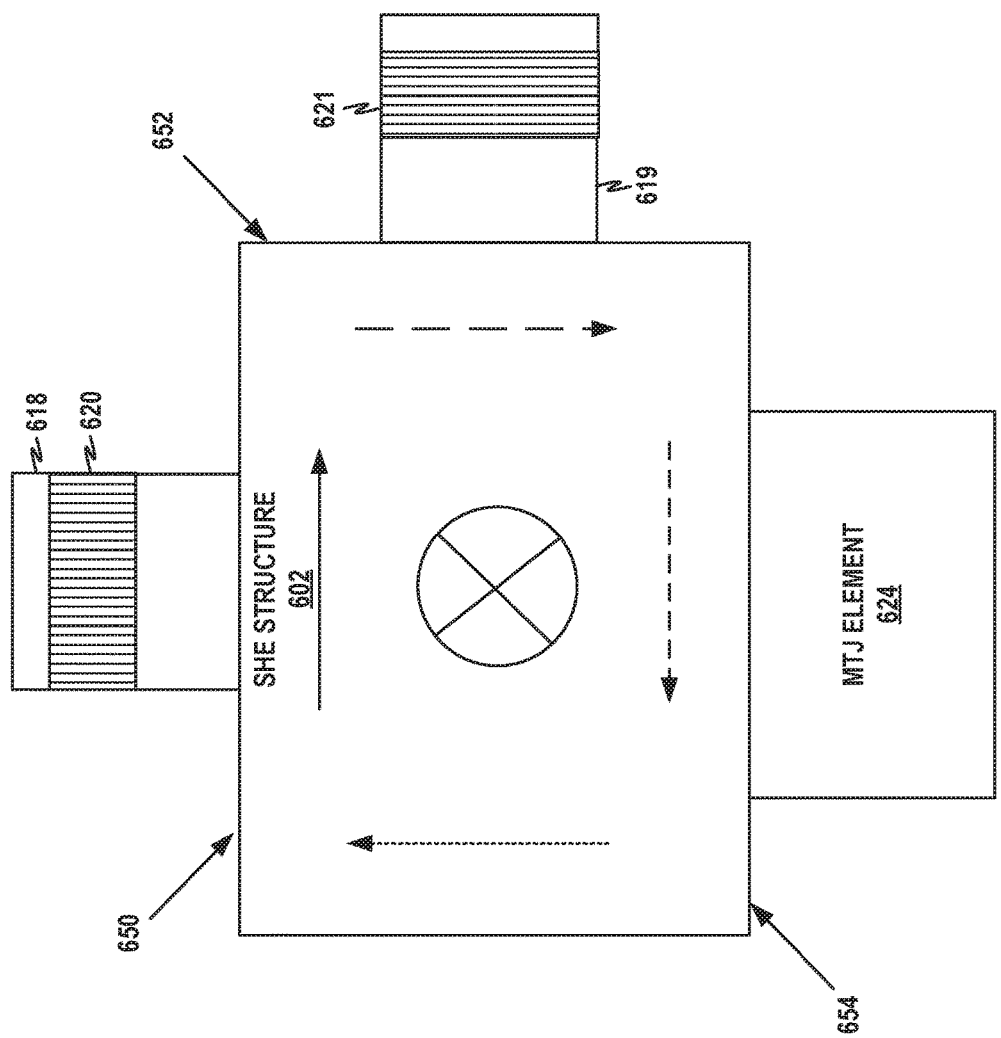
FIG. 6B shows a conceptual illustration of a top-view of the sixth SHE device of FIG. 6A.
Figure 6B:
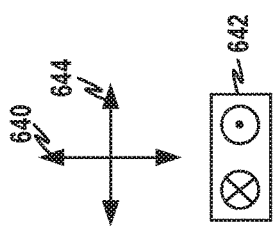

FIG. 6B shows a conceptual illustration of a top-view of the sixth SHE device 600 of FIG. 6A. In the example of FIG. 6B, support structure 618 and magnetic structure 620 are arranged with top surface 650 of SHE structure 602, support structure 619 and magnetic structure 621 are arranged with side surface 652 of SHE structure 602, and MTJ element 624 is arranged below bottom surface 654 of SHE structure 602.

FIG. 7A shows a conceptual illustration of a cross-sectional view of a seventh SHE device 700 configured to detect acceleration using a spin Hall effect. SHE device 700 includes SHE structure 702, free structure 704, tunnel barrier 708, pinned structure 710, bottom electrode 712, switching element 714, processing circuitry 716, support structure 718, and magnetic structure 720, which may be examples of SHE structure 102, free structure 104, tunnel barrier 108, pinned structure 110, bottom electrode 112, switching element 114, processing circuitry 116, support structure 118, and magnetic structure 120 of FIG. 1A, respectively.

Additionally, SHE device 700 includes support structure 719 and magnetic structure 721, which may be examples of support structure 118 and magnetic structure 120 of FIG. 1A, respectively. For example, support structure 719 may space apart magnetic structure 721 from SHE structure 702 such that a magnetic field generated by magnetic structure 721 is moved relative to SHE structure 702 during acceleration.

Further, SHE device 700 includes support structure 723 and magnetic structure 725, which may be examples of support structure 118 and magnetic structure 120 of FIG. 1A, respectively. For example, support structure 723 may space apart magnetic structure 725 from SHE structure 702 such that a magnetic field generated by magnetic structure 725 is moved relative to SHE structure 702 during acceleration.

In the example of FIG. 7A, current flows along first horizontal direction 742. For instance, current may flow from S1 to S2 or current may flow from S2 to S1. Second horizontal direction 744 is perpendicular to first horizontal direction 742 and vertical direction 740. In the example of FIG. 7A, support structure 718 and magnetic structure 720 are arranged on a top surface of SHE structure 702, support structure 719 and magnetic structure 721 are arranged on a first side surface of SHE structure 702, and support structure 723 and magnetic structure 725 are arranged on a second side surface of SHE structure 702.

Figure 7B:
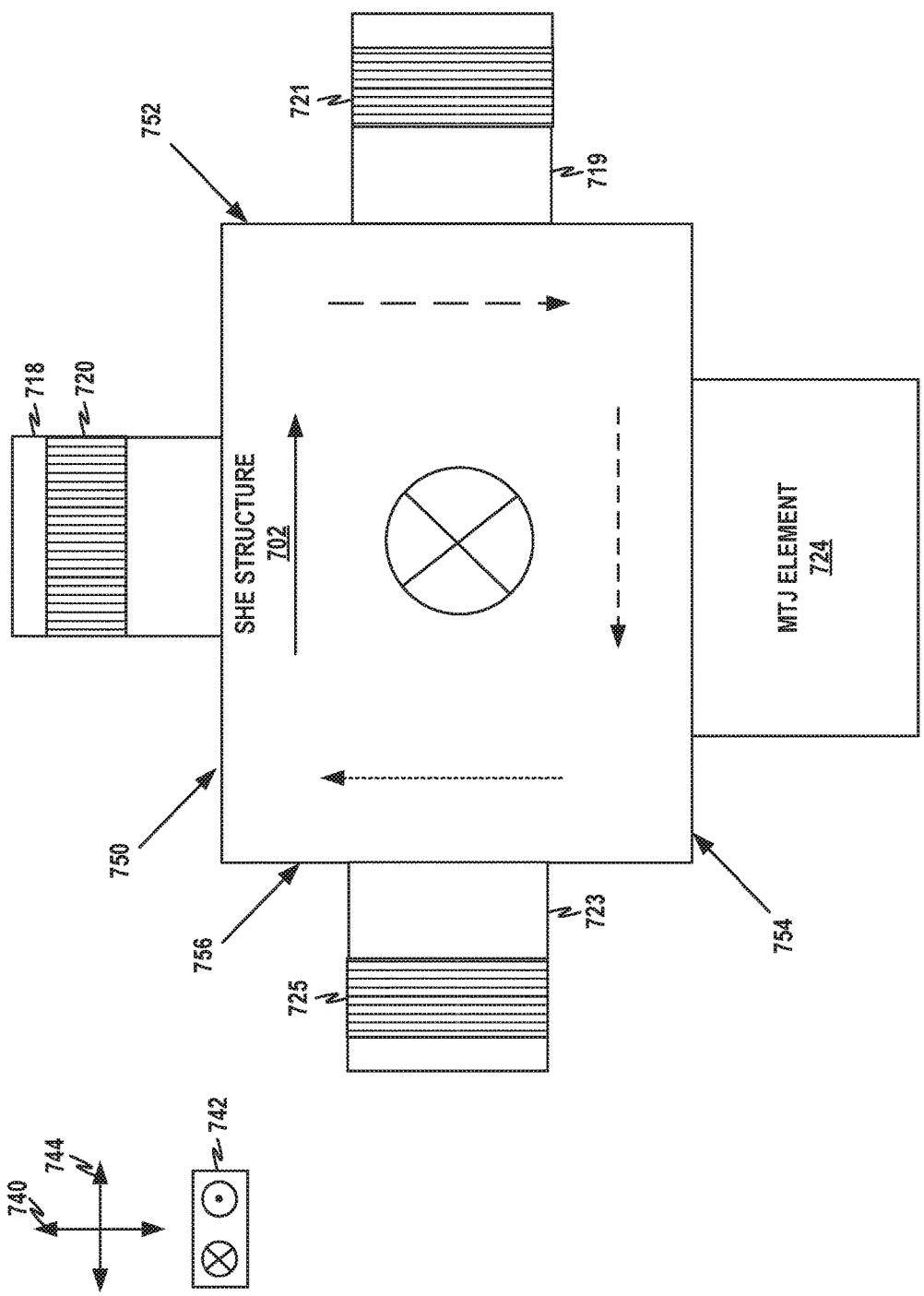
FIG. 7B shows a conceptual illustration of a top-view of the seventh SHE device of FIG. 7A.

FIG. 7B shows a conceptual illustration of a top-view of the seventh SHE device 700 of FIG. 7A. In the example of FIG. 7B, support structure 718 and magnetic structure 720 are arranged with top surface 750 of SHE structure 702, support structure 719 and magnetic structure 721 are arranged with side surface 752 of SHE structure 702, support structure 723 and magnetic structure 725 are arranged with side surface 756 of SHE structure 702, and MTJ element 724 is arranged below bottom surface 754 of SHE structure 702.

Figure 8A:
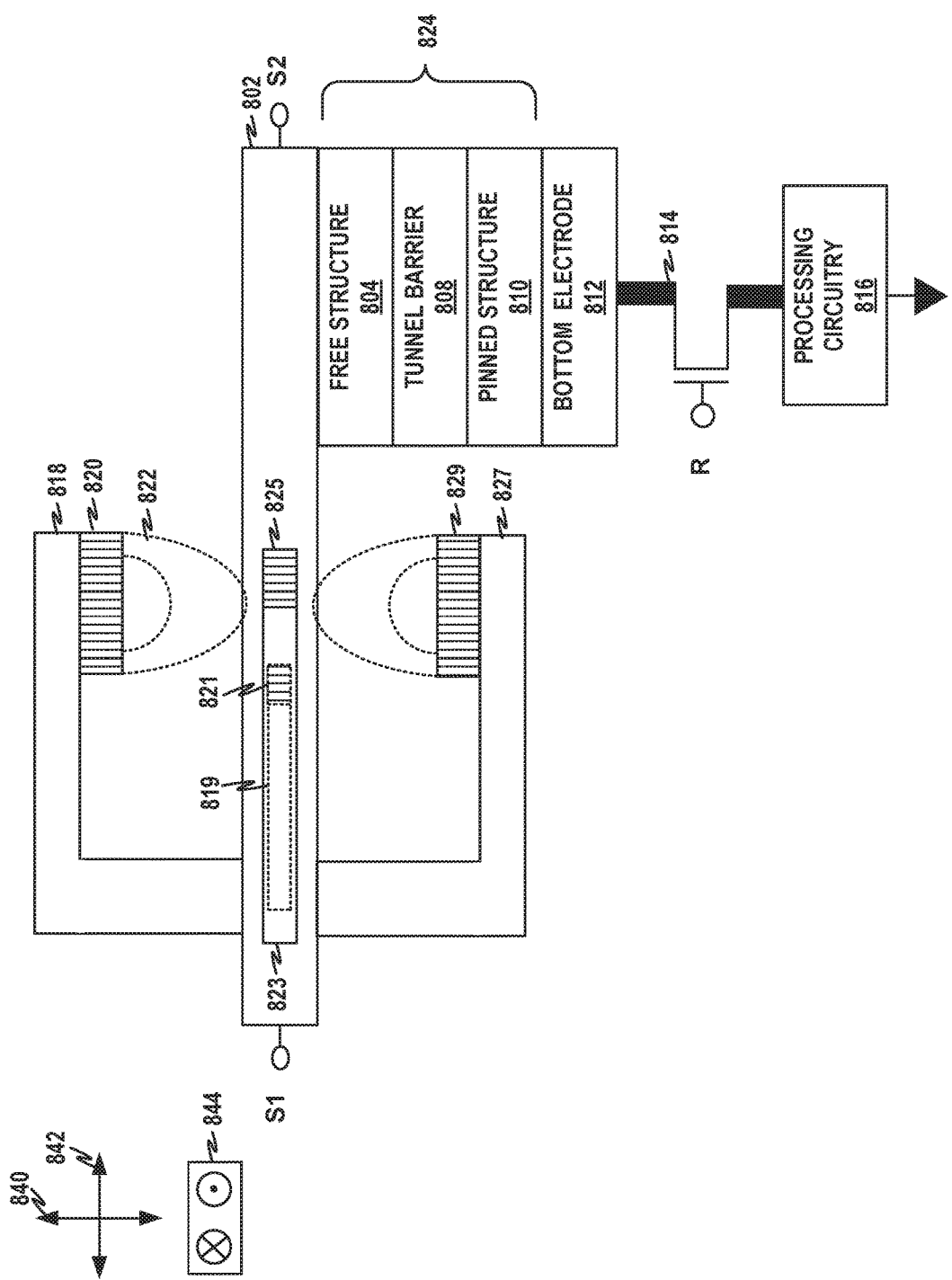
FIG. 8A shows a conceptual illustration of a cross-sectional view of an eighth SHE device configured to detect acceleration using a spin Hall effect.

FIG. 8A shows a conceptual illustration of a cross-sectional view of an eighth SHE device 800 configured to detect acceleration using a spin Hall effect. SHE device 800 includes SHE structure 802, free structure 804, tunnel barrier 808, pinned structure 810, bottom electrode 812, switching element 814, processing circuitry 816, support structure 818, and magnetic structure 820, which may be examples of SHE structure 102, free structure 104, tunnel barrier 108, pinned structure 110, bottom electrode 112, switching element 114, processing circuitry 116, support structure 118, and magnetic structure 120 of FIG. 1A, respectively. Additionally, SHE device 800 includes support structure 819 and magnetic structure 821, support structure 823 and magnetic structure 825, and support structure 827 and magnetic structure 829, each of which may be examples of support structure 118 and magnetic structure 120 of FIG. 1A, respectively. In the example of FIG. 8A, current flows along first horizontal direction 842. For instance, current may flow from S1 to S2 or current may flow from S2 to S1. Second horizontal direction 844 is perpendicular to first horizontal direction 842 and vertical direction 840.

In the example of FIG. 8A, support structure 818 and magnetic structure 820 are arranged on a top surface of SHE structure 802, support structure 819 and magnetic structure 821 are arranged on a first side surface of SHE structure 802, support structure 823 and magnetic structure 825 are arranged on a second side surface of SHE structure 802, and support structure 827 and magnetic structure 829 are arranged on a bottom surface of SHE structure 802.

Figure 8B:
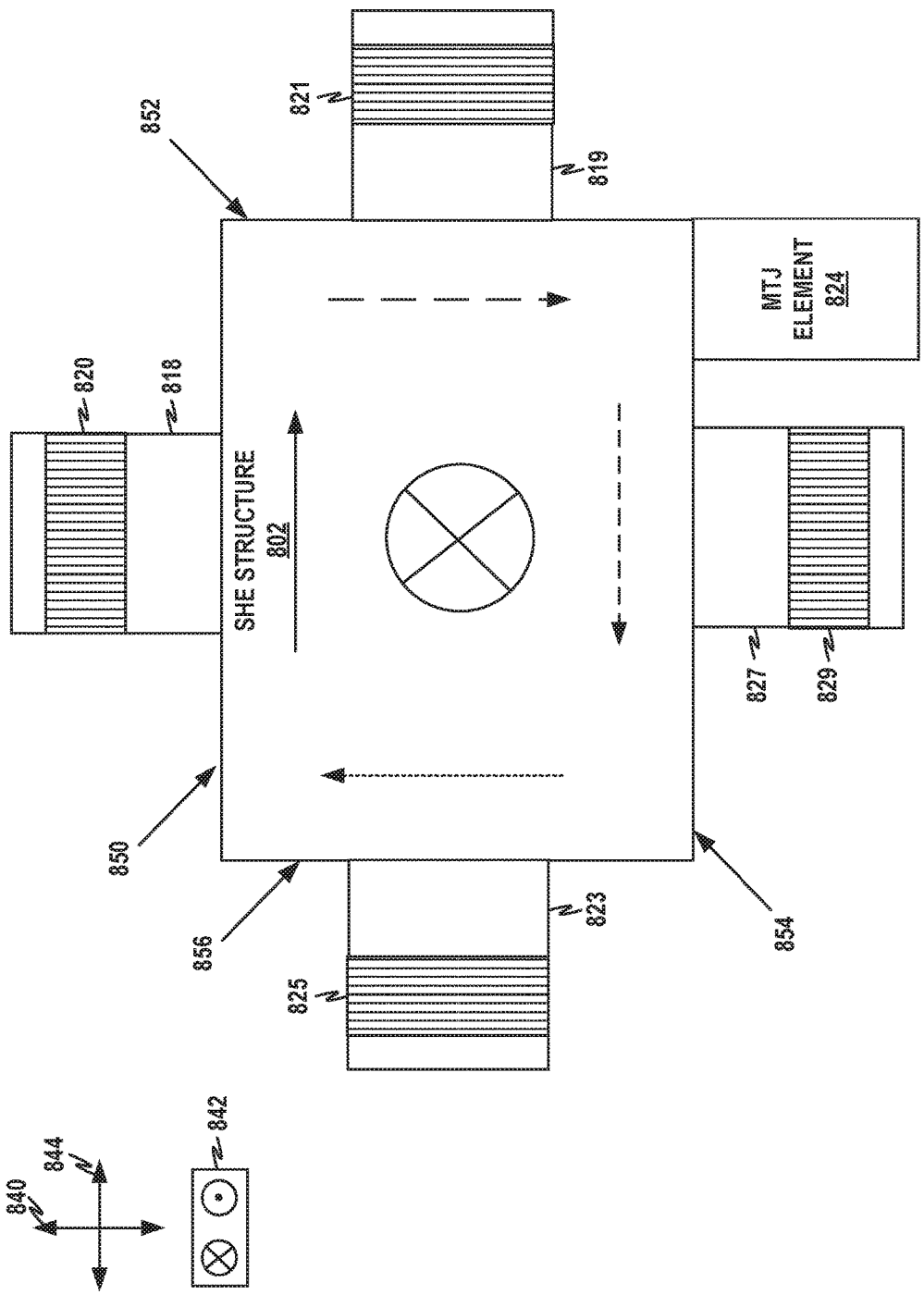
FIG. 8B shows a conceptual illustration of a top-view of the eighth SHE device of FIG. 8A.

FIG. 8B shows a conceptual illustration of a top-view of the eighth SHE device 800 of FIG. 8A. In the example of FIG. 8B, support structure 818 and magnetic structure 820 are arranged with top surface 850 of SHE structure 802, support structure 819 and magnetic structure 821 are arranged with side surface 852 of SHE structure 802, support structure 823 and magnetic structure 825 are arranged with side surface 856 of SHE structure 802, and support structure 827, magnetic structure 829, and MTJ element 824 are arranged with side surface 854 of SHE structure 802.

FIG. 9A shows a conceptual illustration of a cross-sectional view of a ninth SHE device 900 configured to detect acceleration using a spin Hall effect. SHE device 900 includes SHE structure 902, MTJ element 924, support structure 918, and magnetic structure 920, which may be examples of SHE structure 102, MTJ element 124, support structure 118, and magnetic structure 120 of FIG. 1A, respectively. Additionally, SHE device 900 includes support structure 919 and magnetic structure 921, support structure 923 and magnetic structure 925, and support structure 927 and magnetic structure 929, each of which may be examples of support structure 118 and magnetic structure 120 of FIG. 1A, respectively. In the example of FIG. 9A, current flows along first horizontal direction 942. For instance, current may flow from S1 to S2 or current may flow from S2 to S1. Second horizontal direction 944 is perpendicular to first horizontal direction 942 and vertical direction 940.

In the example of FIG. 9A, support structure 918 and magnetic structure 920 are arranged on a top surface of SHE structure 902, support structure 919 and magnetic structure 921 are arranged on a first side surface of SHE structure 902, support structure 923 and magnetic structure 925 are arranged on a second side surface of SHE structure 902, and support structure 927 and magnetic structure 929 are arranged on a bottom surface of SHE structure 902. In other examples, however, one or more of support structure 918, magnetic structure 920, support structure 919, magnetic structure 921, support structure 923, magnetic structure 925, support structure 927, and magnetic structure 929 may be omitted. Although FIG. 9A illustrates magnetic elements as being arranged between a respective support structure and SHE structure 902, in some examples, one or more magnetic elements may be arranged side-by-side with a respective support structure (e.g., see FIGS. 10A, 10B).

Figure 9B:
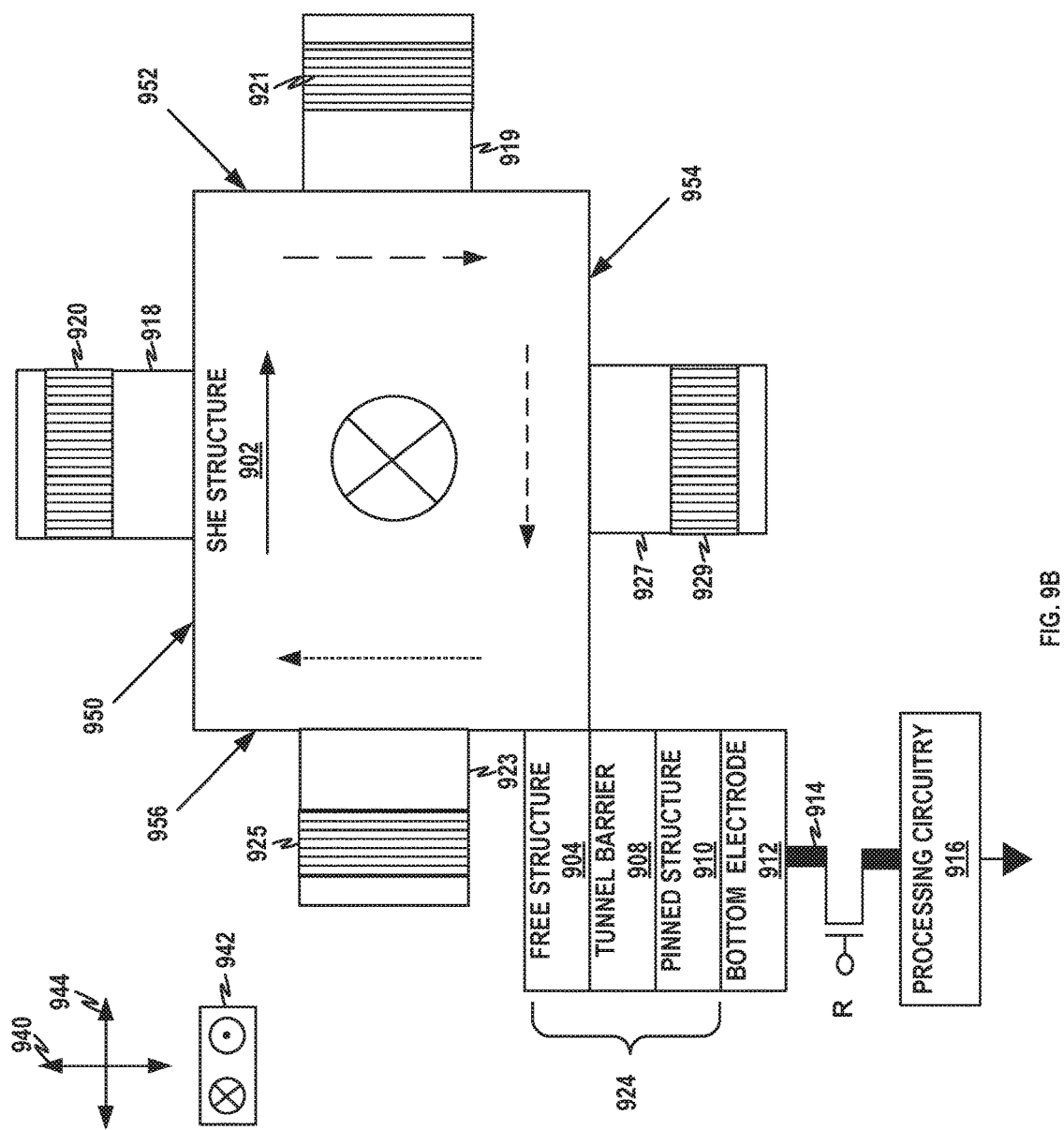
FIG. 9B shows a conceptual illustration of a top-view of the ninth SHE device of FIG. 9A.

FIG. 9B shows a conceptual illustration of a top-view of the ninth SHE device 900 of FIG. 9A. In the example of FIG. 9B, support structure 918 and magnetic structure 920 are arranged with top surface 950 of SHE structure 902, support structure 919 and magnetic structure 921 are arranged with side surface 952 of SHE structure 902, support structure 923 and magnetic structure 925 are arranged with side surface 956 of SHE structure 902, and MTJ element 924 is arranged below bottom surface 954 of SHE structure 902.

As shown, MTJ element 924 may include free structure 904, tunnel barrier 908, pinned structure 910, bottom electrode 912, switching element 914, processing circuitry 916, which may be examples of free structure 104, tunnel barrier 108, pinned structure 110, bottom electrode 112, switching element 114, processing circuitry 116 of FIG. 1A, respectively. In this example, a side surface of free structure 904 is directly adjacent to SHE structure 902.

FIG. 10A shows a conceptual illustration of a cross-sectional view of a tenth SHE device 1000 configured to detect acceleration using a spin Hall effect. SHE device 1000 includes SHE structure 1002, free structure 1004, tunnel barrier 1008, pinned structure 1010, bottom electrode 1012, switching element 1014, processing circuitry 1016, support structure 1018, and magnetic structure 1020, which may be examples of SHE structure 102, free structure 104, tunnel barrier 108, pinned structure 110, bottom electrode 112, switching element 114, processing circuitry 116, support structure 118, and magnetic structure 120 of FIG. 1A, respectively. In the example of FIG. 10A, current flows along first horizontal direction 1042. For instance, current may flow from S1 to S2 or current may flow from S2 to S1. Second horizontal direction 1044 is perpendicular to first horizontal direction 1042 and vertical direction 1040. In the example of FIG. 10A, support structure 1018 and magnetic structure 1020 are arranged on a top surface of SHE structure 1002.

In this example, magnetic structure 1020 is arranged on a side of support structure 1018. For example, a bottom surface of magnetic structure 1020 faces towards SHE structure 1002 and a top surface of magnetic structure 1020 is spaced apart from support structure 1018. In this example, the top surface of magnetic structure 1020 is on an opposite side of magnetic structure 1020 from the bottom surface of magnetic structure 1020.

Figure 10B:
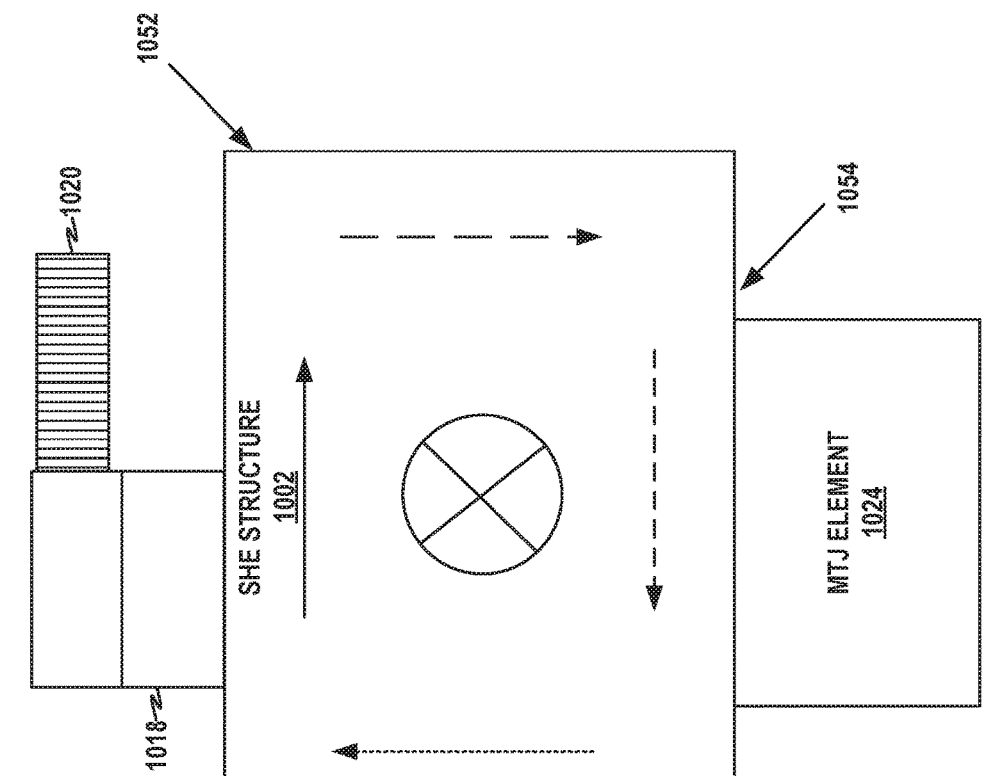
FIG. 10B shows a conceptual illustration of a top-view of the tenth SHE device of FIG. 10A.

FIG. 10B shows a conceptual illustration of a top-view of the tenth SHE device 1000 of FIG. 10A. In the example of FIG. 10B, support structure 1018 and magnetic structure 1020 are arranged with top surface 1050 of SHE structure 1002. However, a support structure having a magnetic structure arranged on a side surface of the support structure may be arranged on any combination of sizes 1050-1054. For instance, support structure 1018 and magnetic structure 1020 may be arranged on surface 1052, surface 1054, or surface 1056. Moreover, while the example of FIGS. 10A, 10B illustrates a single combination of a support structure and magnetic structure, in some examples, SHE structure 1002 may include a support structure configured with a magnetic structure on a side surface of the support structure on any combination of surfaces 1050-1056. For example, SHE structure 1002 may include a support structure configured with a magnetic structure on a side surface of the support structure on 2, 3, or 4 surfaces of SHE structure 1002. Further, while the example of FIGS. 10A, 10B illustrates only a support structure configured with a magnetic structure on a side surface of the support structure, in some examples, SHE structure 1002 may include a support structure configured with a magnetic structure on a bottom surface of the support structure on any combination of surfaces 1050-1056. For example, SHE structure 1002 may further include a support structure configured with a magnetic structure on a bottom surface of the support structure on one or more of surface 1052, surface 1054, or surface 1056.

Figure 11:
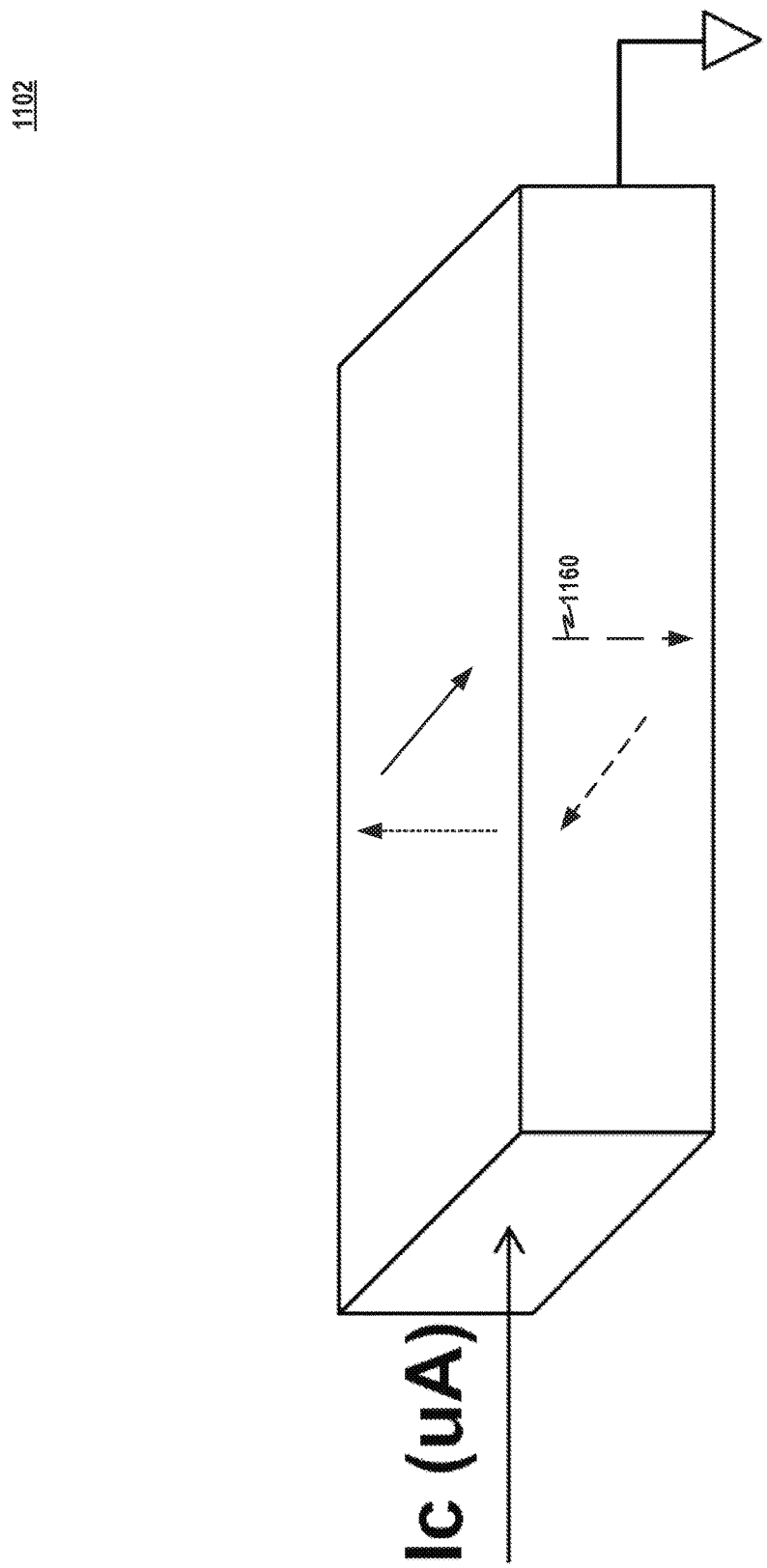
FIG. 11 shows a conceptual illustration of a SHE structure that may be used to implement the techniques of the present disclosure.

FIG. 11 shows a conceptual illustration of a SHE structure 1102 that may be used to implement the techniques of the present disclosure. As shown, a current may be injected through SHE structure 1102, which induces surface spin 1160 accumulation in SHE structure 1102. As used herein, Spin Hall Effect may refer to a separation of spin currents, which are extracted from a charge current, that can diffuse and accumulate at a given surface. The spin currents correspond to electrons differentiated based on the magnetic spin of the electrons. The Spin Hall Effect is considered to have its origins in the coupling of a charge current into spin currents caused by spin-orbit interaction. Spin Hall Effect may include a spin accumulation on lateral boundaries of SHE structure 1102 as indicated by surface spin 1160. The direction of spin current may correspond to a direction of electrons with a given magnetic spin 1160. For example, a reversal of current injected into SHE structure 1102 may result in a corresponding reversal in electrons of a given magnetic spin 1160. It should be understood that spin diffusion and spin accumulation 1160 may result from no magnetic field. Instead, a presence of magnetic field on SHE structure 1102 may reduce or destroy spin diffusion and spin accumulation 1160.

Figure 12:
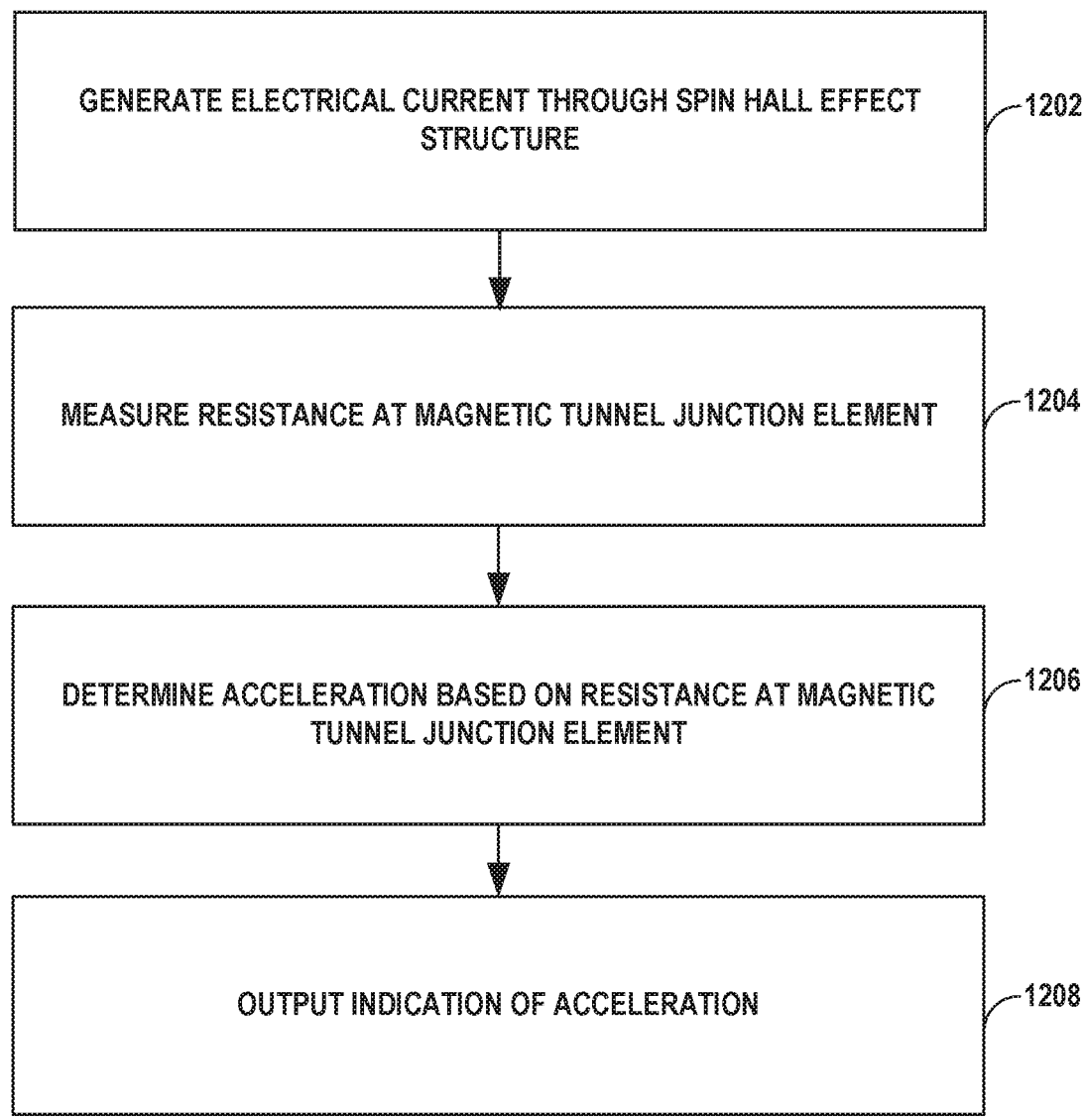
FIG. 12 shows a flowchart of a process for detecting acceleration using a spin Hall effect in accordance with the techniques of this disclosure.

FIG. 12 shows a flowchart of a process for detecting acceleration using a spin Hall effect in accordance with the techniques of this disclosure. The techniques of FIG. 12 may, for example, be performed by a SHE device described above with respect to any combination of FIGS. 1A-1D, 2A-2B, 3A-3B, 4A-4B. 5A-5B, 6A-6B, 7A-7B, 8A-8B, 9A-9B, 10A-10B, and 11. Processing circuitry 116 generates electrical current through SHE structure 102 (1202). Processing circuitry 116 measures a resistance at a MTJ element 124 (1204). Processing circuitry 116 determines an acceleration based on the resistance at the MTJ element (1206). For instance, processing circuitry 1116 determines an acceleration has occurred when the resistance at MTJ element 124 increases or decreases. Processing circuitry 1116 outputs an indication of the acceleration (1208).

Figure 13:
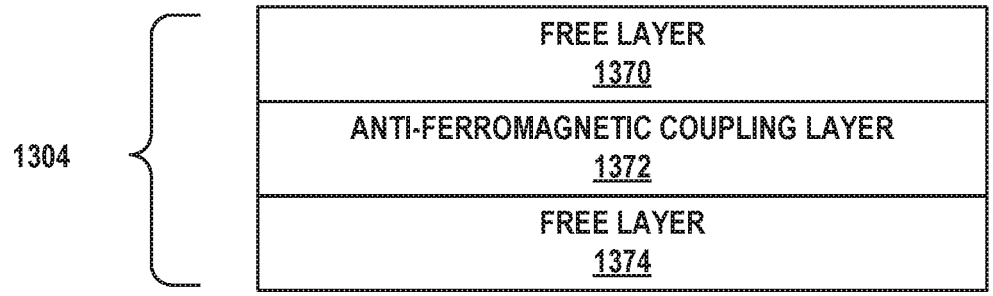
FIG. 13 shows a conceptual illustration of a first free structure that may be used to implement the techniques of the present disclosure.

FIG. 13 shows a conceptual illustration of a first free structure 1304 that may be used to implement the techniques of the present disclosure. Free structure 1304 may be an example of a free structure described above with respect to any combination of FIGS. 1A-1D, 2A-2B, 3A-3B, 4A-4B. 5A-5B, 6A-6B, 7A-7B, 8A-8B, 9A-9B, 10A-10B, 11, and 12. As shown, free structure 1304 may include free layer 1370, anti-ferromagnetic coupling layer 1372, and free layer 1374. Free layer 1370 may include a magnetization direction that is free to switch between a parallel orientation and an antiparallel orientation. Similarly, free layer 1374 may include a magnetization direction that is free to switch between a parallel orientation and an antiparallel orientation.

In the example of FIG. 13, free structure 1304 includes anti-ferromagnetic coupling layer 1372, which is arranged between free layer 1370 and free layer 1374. Anti-ferromagnetic coupling layer 1372 may be configured to stabilize a magnetic state of free layer 1370 and/or free layer 1374. Anti-ferromagnetic coupling layer 1372 may be formed of, for example, Ruthenium (Ru). Although the example of FIG. 13 illustrates a free structure with two free layers, in some examples, a free structure may include one free layer (e.g., without anti-ferromagnetic coupling layer 1582) or more than two free layers (e.g., each pair of free layers spaced apart by a respective anti-ferromagnetic coupling layer).

Figure 14:
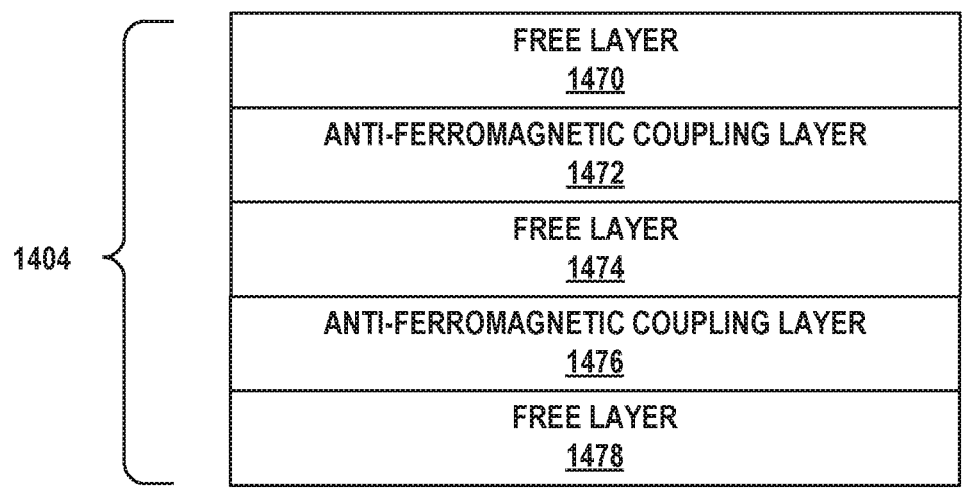
FIG. 14 shows a conceptual illustration of a second free structure that may be used to implement the techniques of the present disclosure.

FIG. 14 shows a conceptual illustration of a second free structure that may be used to implement the techniques of the present disclosure. Free structure 1404 may be an example of a free structure described above with respect to any combination of FIGS. 1A-1D, 2A-2B, 3A-3B, 4A-4B. 5A-5B, 6A-6B, 7A-7B, 8A-8B, 9A-9B, 10A-10B, and 11-13. As shown, free structure 1404 may include free layer 1470, anti-ferromagnetic coupling layer 1472, free layer 1474, anti-ferromagnetic coupling layer 1476, and free layer 1478. Free layers 1470, 1474, and 1478 may each include a magnetization direction that is free to switch between a parallel orientation and an antiparallel orientation.

In the example of FIG. 14, free structure 1404 includes anti-ferromagnetic coupling layer 1472, which is arranged between free layer 1470 and free layer 1474, and anti-ferromagnetic coupling layer 1478, which is arranged between free layer 1474 and free layer 1478. Anti-ferromagnetic coupling layers 1472 and 1478 may be configured to stabilize a magnetic state of one or more of free layers 1470, 1474, and 1478. Anti-ferromagnetic coupling layer 1472 and/or anti-ferromagnetic coupling layer 1478 may be formed of, for example, Ruthenium (Ru). Although the example of FIG. 14 illustrates a free structure with three free layers, in some examples, a free structure may include more than three free layers.

Figure 15:
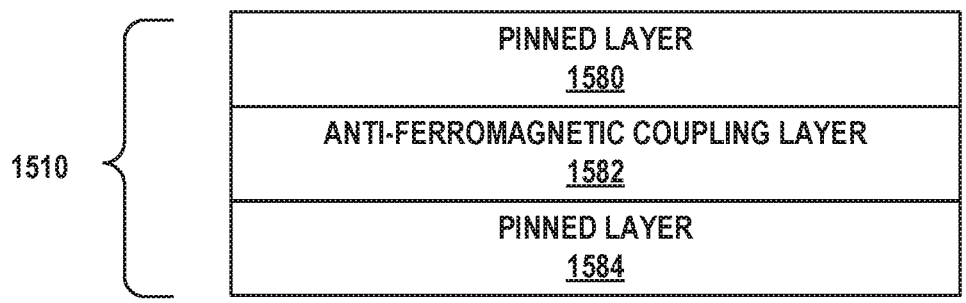
FIG. 15 shows a conceptual illustration of a first pinned structure that may be used to implement the techniques of the present disclosure.

FIG. 15 shows a conceptual illustration of a first pinned structure 1510 that may be used to implement the techniques of the present disclosure. Pinned structure 1510 may be an example of a pinned structure described above with respect to any combination of FIGS. 1A-1D, 2A-2B, 3A-3B, 4A-4B. 5A-5B, 6A-6B, 7A-7B, 8A-8B, 9A-9B, 10A-10B, and 11-14. As shown, pinned structure 1510 may include pinned layer 1580, anti-ferromagnetic coupling layer 1582, and pinned layer 1584. Pinned layer 1580 may include a magnetization direction that is fixed or "pinned" to a single orientation. For example, pinned layer 1580 may be pinned in a parallel orientation. In other examples, pinned layer 1580 may be pinned in an antiparallel orientation. Similarly, pinned layer 1584 may include a magnetization direction that is fixed or "pinned" to a single orientation.

In the example of FIG. 15, pinned structure 1510 includes anti-ferromagnetic coupling layer 1582, which is arranged between pinned layer 1580 and pinned layer 1584. Anti-ferromagnetic coupling layer 1582 may be configured to stabilize a magnetic state of pinned layer 1580 and/or pinned layer 1584. Anti-ferromagnetic coupling layer 1582 may be formed of, for example, Ruthenium (Ru). Although the example of FIG. 15 illustrates a pinned structure with two pinned layers, in some examples, a pinned structure may include one pinned layer (e.g., without anti-ferromagnetic coupling layer 1582) or more than two pinned layers (e.g., each pair of pinned layers spaced apart by a respective anti-ferromagnetic coupling layer).

Figure 16:
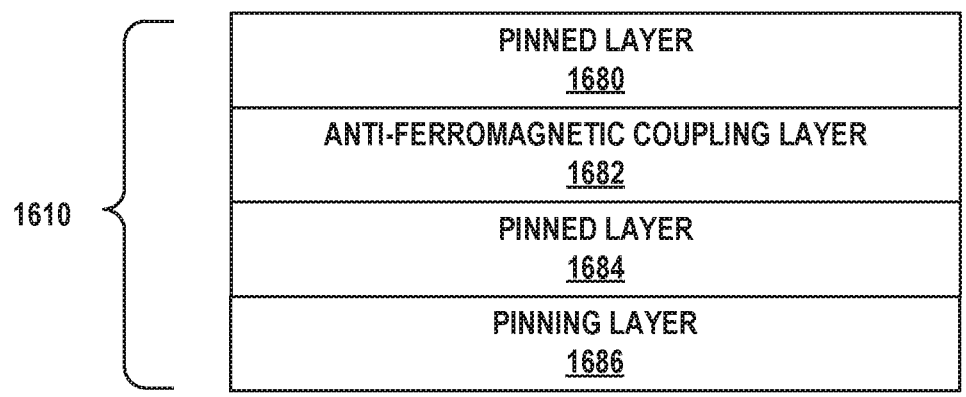
FIG. 16 shows a conceptual illustration of a second pinned structure that may be used to implement the techniques of the present disclosure.

FIG. 16 shows a conceptual illustration of a second pinned structure 1610 that may be used to implement the techniques of the present disclosure. Pinned structure 1610 may be an example of a pinned structure described above with respect to any combination of FIGS. 1A-1D, 2A-2B, 3A-3B, 4A-4B, 5A-5B, 6A-6B, 7A-7B, 8A-8B, 9A-9B, 10A-10B, and 11-15. As shown, pinned structure 1610 may include pinned layer 1680, anti-ferromagnetic coupling layer 1682, pinned layer 1684, and pinning layer 1686. Pinned layer 1680 may include a magnetization direction that is fixed or "pinned" to a single orientation. For example, pinned layer 1680 may be pinned in a parallel orientation. In other examples, pinned layer 1680 may be pinned in an antiparallel orientation. Similarly, pinned layer 1684 may include a magnetization direction that is fixed or "pinned" to a single orientation. In some examples, pinning layer 1686 may be arranged directly adjacent to a bottom electrode and pinned layer 1680 may be arranged directly adjacent to a tunnel barrier.

In the example of FIG. 16, pinned structure 1610 includes anti-ferromagnetic coupling layer 1682, which is arranged between pinned layer 1680 and pinned layer 1684. Anti-ferromagnetic coupling layer 1682 may be configured to stabilize a magnetic state of pinned layer 1680 and/or pinned layer 1684. Anti-ferromagnetic coupling layer 1682 may be formed of, for example, Ruthenium (Ru). Although the example of FIG. 16 illustrates a pinned structure with two pinned layers, in some examples, a pinned structure may include one pinned layer or more than two pinned layers.

Pinning layer 1686 may be configured to stabilize a magnetic state of pinned layer 1680 and/or pinned layer 1684. Pinning layer 1686 may be formed of an anti-ferromagnetic material. For example, pinning layer 1686 may be formed of, for example, but not limited to, platinum manganese (PtMn), Ferro Manganese (FeMn), iridium manganese (IrMn), or another material. In some examples, pinning layer 1686 may be arranged directly adjacent to a bottom electrode and pinned layer 1680 may be arranged directly adjacent to a tunnel barrier.

Figure 17:
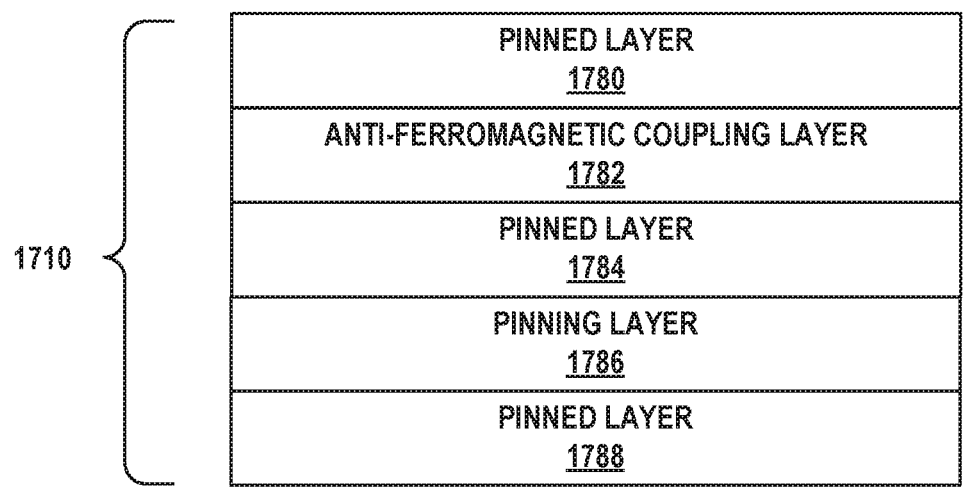
FIG. 17 shows a conceptual illustration of a third pinned structure that may be used to implement the techniques of the present disclosure.

FIG. 17 shows a conceptual illustration of a second pinned structure 1710 that may be used to implement the techniques of the present disclosure. Pinned structure 1710 may be an example of a pinned structure described above with respect to any combination of FIGS. 1A-1D, 2A-2B, 3A-3B, 4A-4B, 5A-5B, 6A-6B, 7A-7B, 8A-8B, 9A-9B, 10A-10B, and 11-16.

As shown, pinned structure 1710 may include pinned layer 1780, anti-ferromagnetic coupling layer 1782, pinned layer 1784, pinning layer 1786, and pinned layer 1788. Pinned layers 1780, 1784, and 1788 may each include a magnetization direction that is fixed or "pinned" to a single orientation. The addition of pinned layer 1788 may help to improve a stability of one or more of pinned layers 1780, 1784, and 1788. Pinning layer 1786 may be formed of an anti-ferromagnetic material. For example, pinning layer 1786 may be formed of, for example, but not limited to, platinum manganese (PtMn), Ferro Manganese (FeMn), iridium manganese (IrMn), or another material. In some examples, pinned layer 1788 may be arranged directly adjacent to a bottom electrode and pinned layer 1780 may be arranged directly adjacent to a tunnel barrier.

In the example of FIG. 17, pinned structure 1710 includes anti-ferromagnetic coupling layer 1782, which is arranged between pinned layer 1780 and pinned layer 1784. Anti-ferromagnetic coupling layer 1782 may be configured to stabilize a magnetic state of pinned layer 1780 and/or pinned layer 1784. Anti-ferromagnetic coupling layer 1782 may be formed of, for example, Ruthenium (Ru). Although the example of FIG. 17 illustrates a pinned structure with two pinned layers, in some examples, a pinned structure may include one pinned layer or more than two pinned layers.

The term "circuitry" as used herein may refer to any of the foregoing structure or any other structure suitable for processing program code and/or data or otherwise implementing the techniques described herein. Circuitry may, for example, any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. A device for detecting acceleration using a spintronic Hall effect, the device comprising:
 a spin Hall effect (SHE) structure;
 a Magnetic Tunnel Junction (MTJ) element, the MTJ element comprising a free structure, a pinned structure, and a tunnel barrier arranged between the free structure and the pinned structure;
 a magnetic structure spaced apart from the spin Hall effect structure such that a magnetic field generated by the magnetic structure is moved relative to the spin Hall effect structure during acceleration; and processing circuitry configured to:
generate electrical current through the spin Hall effect structure, measure a resistance at the MTJ element; and
determine acceleration based on the resistance at the MTJ element.

2. The device of claim 1, wherein the free structure comprises:
a first free layer;
an anti-ferromagnetic coupling layer; and
a second free layer, wherein the anti-ferromagnetic coupling layer is arranged between the first free layer and the second free layer.

3. The device of claim 2, wherein the anti-ferromagnetic coupling layer is a first anti-ferromagnetic coupling layer and wherein the free structure further comprises:
a third free layer; and
a second anti-ferromagnetic coupling layer, wherein the second anti-ferromagnetic coupling layer is arranged between the second free layer and the third free layer.

4. The device of claim 1, wherein the free structure includes one free layer.

5. The device of claim 1, wherein the magnetic structure is arranged above the SHE structure and the MTJ element is arranged below the SHE structure.

6. The device of claim 1, wherein the magnetic structure is arranged on a side surface of the SHE structure and the MTJ element is arranged below a bottom surface of the SHE structure, wherein the side surface is adjacent to the bottom surface.

7. The device of claim 1, wherein the magnetic structure is a first magnetic structure and wherein a second magnetic structure is spaced apart from the spin Hall effect structure such that a magnetic field generated by the second magnetic structure is moved relative to the spin Hall effect structure during acceleration.

8. The device of claim 7,
wherein the first magnetic structure is arranged on a first side surface of the SHE structure; and
wherein the second magnetic structure is arranged on a second side surface of the SHE structure that is on an opposite side of the SHE structure from the first side surface.

9. The device of claim 8, wherein the MTJ element is arranged below a bottom surface of the SHE structure, the bottom surface of the SHE structure being adjacent to the first side surface and the second side surface.

10. The device of claim 7,
wherein the first magnetic structure is arranged above the SHE structure and the MTJ element is arranged below the SHE structure; and
wherein the second magnetic structure is arranged on a side surface of the SHE structure.

11. The device of claim 7, wherein a third magnetic structure is spaced apart from the spin Hall effect structure such that a magnetic field generated by the third magnetic structure is moved relative to the spin Hall effect structure during acceleration.

12. The device of claim 11, wherein a fourth magnetic structure is spaced apart from the spin Hall effect structure such that a magnetic field generated by the fourth magnetic structure is moved relative to the spin Hall effect structure during acceleration.

13. The device of claim 1, wherein a top surface of the free structure is adjacent to the SHE structure and wherein a bottom surface of the free structure is adjacent to the tunnel barrier, the top surface being on an opposite side of the SHE structure from the bottom surface.

14. The device of claim 1, wherein a side surface of the free structure is adjacent to the SHE structure and wherein a bottom surface of the free structure is adjacent to the tunnel barrier, the side surface being on adjacent to the bottom surface of the SHE structure from the bottom surface.

15. The device of claim 1, wherein the magnetic structure is attached to a support structure and wherein the magnetic structure is arranged between the support structure and the SHE structure.

16. The device of claim 1, wherein the magnetic structure is attached to a support structure and wherein a bottom surface of the magnetic structure faces towards the SHE structure and a top surface of the magnetic structure is spaced apart from the support structure, the top surface being on an opposite side of the magnetic structure from the bottom surface.

17. A method for detecting acceleration using a spintronic Hall effect, the method comprising:
generating, by processing circuitry, electrical current through a spin Hall effect structure, wherein a magnetic structure is spaced apart from the spin Hall effect structure such that a magnetic field generated by the magnetic structure is moved relative to the spin Hall effect structure during acceleration;
measuring, by the processing circuitry, a resistance at a Magnetic Tunnel Junction (MTJ) element, the MTJ element comprising a free structure, a pinned structure, and a tunnel barrier arranged between the free structure and the pinned structure, wherein the free structure is arranged with the spin Hall effect structure such that current in the spin Hall effect structure induces spin-torque transfer into the free structure; and
determining, by the processing circuitry, acceleration based on the resistance at the MTJ element.

18. The method of claim 17, wherein the free structure comprises:
a first free layer;
an anti-ferromagnetic coupling layer; and
a second free layer, wherein the anti-ferromagnetic coupling layer is arranged between the first free layer and the second free layer.

19. The method of claim 18, wherein the anti-ferromagnetic coupling layer is a first anti-ferromagnetic coupling layer and wherein the free structure further comprises:
a third free layer; and
a second anti-ferromagnetic coupling layer, wherein the second anti-ferromagnetic coupling layer is arranged between the second free layer and the third free layer.

20. A device for detecting acceleration using a spintronic Hall effect, the device comprising:
means for generating electrical current through a spin Hall effect structure, wherein a magnetic structure is spaced apart from the spin Hall effect structure such that a magnetic field generated by the magnetic structure is moved relative to the spin Hall effect structure during acceleration;
means for measuring a resistance at a Magnetic Tunnel Junction (MTJ) element, the MTJ element comprising a free structure, a pinned structure, and a tunnel barrier arranged between the free structure and the pinned structure, wherein the free structure is arranged with the spin Hall effect structure such that current in the spin Hall effect structure induces spin-torque transfer into the free structure; and means for determining acceleration based on the resistance at the MTJ element.

\* \* \* \* \*